(12) United States Patent
Koike et al.

(10) Patent No.: US 8,012,653 B2
(45) Date of Patent: Sep. 6, 2011

(54) SUBSTRATE FOR EUV MASK BLANKS

(75) Inventors: Akio Koike, Chiyoda-ku (JP); Ken Ebihara, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 128 days.

(21) Appl. No.: 12/490,833

(22) Filed: Jun. 24, 2009

(65) Prior Publication Data

US 2010/0028787 A1 Feb. 4, 2010

(30) Foreign Application Priority Data

Aug. 1, 2008 (JP) ................................. 2008-199543
Nov. 5, 2008 (JP) ................................. 2008-284444

(51) Int. Cl.
*G03F 1/00* (2006.01)

(52) U.S. Cl. .......................................................... 430/5

(58) Field of Classification Search ............... 430/5, 322, 430/323; 378/35; 501/55
See application file for complete search history.

(56) References Cited

U.S. PATENT DOCUMENTS

| | | | |
|---|---|---|---|
| 5,970,751 A | 10/1999 | Maxon et al. | |
| 6,352,803 B1 | 3/2002 | Tong et al. | |
| 6,465,272 B1 | 10/2002 | Davis, Jr. et al. | |
| 6,576,380 B2 | 6/2003 | Davis, Jr. et al. | |
| 6,931,097 B1 | 8/2005 | Davis, Jr. et al. | |
| 7,053,017 B2 | 5/2006 | Hrdina et al. | |
| 7,390,596 B2 | 6/2008 | Ishibashi et al. | |
| 7,410,922 B2 | 8/2008 | Iwahashi et al. | |
| 7,419,924 B2 | 9/2008 | Koike et al. | |
| 7,429,546 B2 | 9/2008 | Iwahashi et al. | |
| RE40,586 E | 11/2008 | Hrdina et al. | |
| 7,462,574 B2 | 12/2008 | Iwahashi et al. | |
| 7,538,052 B2 | 5/2009 | Iwahashi et al. | |
| 7,585,598 B2 * | 9/2009 | Maida et al. ...................... 430/5 |
| 2002/0157421 A1 | 10/2002 | Ackerman et al. | |
| 2007/0066066 A1 | 3/2007 | Kojima et al. | |
| 2008/0032213 A1 | 2/2008 | Kikugawa et al. | |
| 2008/0057291 A1 | 3/2008 | Ikuta et al. | |
| 2008/0103038 A1 | 5/2008 | Kawata et al. | |
| 2008/0132150 A1 * | 6/2008 | Arserio et al. .................. 451/36 |
| 2008/0311487 A1 | 12/2008 | Ito et al. | |
| 2009/0122281 A1 | 5/2009 | Iwahashi et al. | |

FOREIGN PATENT DOCUMENTS

| | | |
|---|---|---|
| JP | 63-24937 | 5/1988 |
| JP | 2004-6798 | 1/2004 |
| JP | 2007-213020 | 8/2007 |
| WO | WO 00/75727 | 12/2000 |

OTHER PUBLICATIONS

U.S. Appl. No. 12/718,776, filed Mar. 5, 2010, Koike, et al.
C. W. Gwyn, et al., "Extreme ultraviolet lithography", J. Vac. Sci. Technol. B16, No. 6, Nov./Dec. 1998, pp. 3142-3149.

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

A substrate that is suitable for an EUV mask or an EUV mask blank and excellent in flatness, is provided.
A substrate for an EUV mask blank, which is made of a silica glass containing from 1 to 12 mass % of $TiO_2$, wherein the surface roughness (rms) in a surface quality area of the substrate is at most 2 nm, and the maximum variation (PV) of the stress in the surface quality area of the substrate is at most 0.2 MPa.

33 Claims, 6 Drawing Sheets

SUBSTRATE FOR EUV MASK BLANKS

BACKGROUND OF THE INVENTION

1. Field of the Invention

The present invention relates to a substrate suitably used for a mask or a mask blank for EUV lithography.

2. Discussion of Background

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, is considered to be promising as an exposure technique for 45 nm or below (refer to Non-Patent Document 1). In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask (hereinafter referred to as "EUV mask") and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorber layer to absorb EUV light, formed thereon in this order. As the reflective layer, a multilayer reflective film is usually used wherein high refractive index layers and low refractive index layers are alternately stacked to increase a light reflectance when irradiating the layer surface with EUV light. For the absorber layer, it is common to employ a material having a high absorption coefficient for EUV light, specifically e.g. a material containing Cr or Ta as the main component. As the substrate, a material having a low thermal expansion coefficient and thereby showing no deformation even under EUV light irradiation, is required, and e.g. a glass having a low thermal expansion coefficient is considered for the substrate.

Patent Documents 1 to 3 describe examples of preferred properties of the substrate for EUV masks. Further, Patent Document 4 describes a preferred level of striae of a substrate for EUV masks, and the document specifically recites that "According to certain embodiments of the present invention, applicants have demonstrated that striae in silica-titania ultra low expansion glass boules can be reduced by modification of several manufacturing parameters during flame hydrolysis. Applicants have been able to manufacture boules and extreme ultraviolet elements having rms striae values less than about 0.05 MPa, preferably less than about 0.03 MPa, and more preferably less than about 0.02 MPa. Peak to valley striae values were reduced to less than 0.2 MPa and preferably less than 0.15 MPa.".

Further, as the method for measuring a striae level, Patent Document 4 describes that "Thus, the polariscope measures retardance through a sample as a function of position. The spatial resolution of a polariscope is much smaller than the size of the striae in titania-silica glass and therefore allows for measurement through striae layers. The retardance observed in the polariscope indicates stresses between striae layers, which are most likely due to thermal expansion mismatch between the layers. FIG. 3 shows a comparison of striae measurements made on a sample. The lower line in FIG. 3 represents striae measurements made by a polariscope, and the upper line represents measurements made by a microprobe. The polariscope used is available from Cambridge Research Instrumentation, Model LC, which was used with a Nikon microscope. As indicated by FIG. 3, there is good correlation between the two techniques, which shows that the polariscope can be used to measure striae in titania-silica glass and optical elements such as extreme ultraviolet lithographic elements.".

However, this Patent Document 4 describes a process for producing a glass body (it is called as boule) before being cut into a substrate, but this does not clearly describe as to a production process for producing a substrate achieving the above striae level. Further, in the process described in Patent Document 4, it is unclear how the stress is measured. Further, in the process of Patent Document 4, although the detail is unclear, it seems that the stress of a glass called as a boule which is to be cut into a substrate, is measured, but it is not possible to determine the measured stress as the stress of the substrate itself. Further, Patent Document 5 and 6 describe the film constructions of EUV mask blanks.

Patent Document 1: U.S. Pat. No. 6,465,272
Patent Document 2: U.S. Pat. No. 6,576,380
Patent Document 3: U.S. Pat. No. 6,931,097
Patent Document 4: U.S. Pat. No. 7,053,017
Patent Document 5: JP-A-2004-6798 (U.S. Pat. No. 7,390,596)
Patent Document 6: U.S. Pat. No. 7,390,596
Patent Document 7: JP-B-63-24937
Patent Document 8: JP-A-2007-213020 (US-A-2008/311487)
Patent Document 9: US-A-2008/311487
Patent Document 10: WO00/75727
Patent Document 11: U.S. Pat. No. 6,352,803
Non-Patent Document
Non-Patent Document 1: Extreme ultraviolet lithography C. W. Gwyn et al J. Vac. Sci. Tech. B 16(6) No. December 1998

SUMMARY OF THE INVENTION

It is an object of the present invention to provide a substrate excellent in flatness that is to be used for a mask or for a mask blank for EUV lithography.

In order to achieve the above object, the present invention provides the following (1) to (33).

(1) A substrate for an EUV mask blank, which is made of a silica glass containing from 1 to 12 mass % of $TiO_2$, wherein the surface roughness (rms) in a surface quality area of the substrate is at most 2 nm, and the standard deviation ($\sigma$) of the stress in the surface quality area of the substrate is at most 0.04 MPa.

(2) A substrate for an EUV mask blank, which is made of a silica glass containing from 1 to 12 mass % of $TiO_2$, wherein the surface roughness (rms) in a surface quality area of the substrate is at most 2 nm, and the maximum variation (PV) of the stress in the surface quality area of the substrate is at most 0.2 MPa.

(3) The substrate for an EUV mask blank according to the above (1), wherein the maximum variation (PV) of the stress in the surface quality area of the substrate is at most 0.2 MPa.

(4) The substrate for an EUV mask blank according to any one of the above (1) to (3), wherein the surface roughness (rms) in the surface quality area of the substrate is at most 1 nm.

(5) The substrate for an EUV mask blank according to any one of the above (1) to (4), wherein the standard deviation (σ) outside the surface quality area of the substrate is more than 0.05 MPa.

(6) The substrate for an EUV mask blank according to any one of the above (1) to (4), wherein the maximum variation (PV) of the stress outside the surface quality area of the substrate is more than 0.2 MPa.

(7) The substrate for an EUV mask blank according to the above (5), wherein the maximum variation (PV) of the stress outside the surface quality area of the substrate is more than 0.2 MPa.

(8) The substrate for an EUV mask blank according to any one of the above (1) to (4), wherein the standard deviation (σ) of the stress outside the surface quality area is at least 0.02 MPa higher than the standard deviation (σ) of the stress in the surface quality area.

(9) The substrate for an EUV mask blank according to any one of the above (1) to (4), wherein the maximum variation (PV) outside the surface quality area is at least 0.1 MPa higher than the maximum variation (PV) in the surface quality area.

(10) The substrate for an EUV mask blank according to the above (8), wherein the maximum variation (PV) of the stress outside the surface quality area of the substrate is at least 0.1 MPa higher than the maximum variation (PV) in the surface quality area.

(11) The substrate for an EUV mask blank according to any one of the above (1) to (10), wherein the thermal expansion coefficient of the substrate is 0±200 ppb/° C. in a temperature range of from 0 to 100° C.

(12) The substrate for an EUV mask blank according to any one of the above (1) to (11), wherein the fictive temperature of the substrate is less than 1,000° C.

(13) The substrate for an EUV mask blank according to any one of the above (1) to (12), wherein the variation of the fictive temperature in the entire substrate is at most 100° C.

(14) The substrate for an EUV mask blank according to any one of the above (1) to (13), wherein the OH group concentration in the substrate is at most 600 ppm.

(15) The substrate for an EUV mask blank according to the above (14), wherein the variation of the OH group concentration in the entire substrate is at most 50 ppm.

(16) The substrate for an EUV mask blank according to any one of the above (1) to (15), wherein the variation Δn of the refractive index of the substrate is within $4\times10^{-4}$.

(17) The substrate for an EUV mask blank according to any one of the above (1) to (16), wherein the surface roughness (rms) in the surface quality area of the substrate is at most 0.8 nm.

(18) The substrate for an EUV mask blank according to any one of the above (1) to (17), wherein the temperature at which the thermal expansion coefficient of the substrate becomes 0 ppb/° C. is 22±3° C.

(19) The substrate for an EUV mask blank according to any one of the above (1) to (17), wherein the temperature at which the thermal expansion coefficient of the substrate becomes 0 ppb/° C. is from 40 to 100° C.

(20) The substrate for an EUV mask blank according to any one of the above (1) to (19), wherein the chlorine concentration of the substrate is at most 50 ppm.

(21) The substrate for an EUV mask blank according to any one of the above (1) to (20), wherein the fluorine concentration of the substrate is at least 100 ppm.

(22) The substrate for an EUV mask blank according to any one of the above (1) to (21), wherein the boron concentration of the substrate is at least 10 ppb.

(23) The substrate for an EUV mask blank according to any one of the above (1) to (22), wherein the hydrogen concentration of the substrate is at least $5\times10^{16}$ molecules/cm$^3$.

(24) The substrate for an EUV mask blank according to any one of the above (1) to (23), wherein the $Ti^{3+}$, concentration of the substrate is at most 70 ppm.

(25) The substrate for an EUV mask blank according to any one of the above (1) to (24), wherein no concave pit of at least 60 nm is present on a surface in the surface quality area of the substrate.

(26) The substrate for an EUV mask blank according to any one of the above (1) to (25), which is produced by a two-step forming method comprising heating a transparent $TiO_2$—$SiO_2$ glass body at a forming temperature to form a first formed body, cutting the outer periphery of the first formed body, and heating the first formed body at a forming temperature to form a second formed body.

(27) The substrate for an EUV mask blank according to any one of the above (1) to (26) which is produced by a method of maintaining a formed $TiO_2$—$SiO_2$ glass body formed into a predetermined shape, at a temperature of from 800 to 1,200° C. for 2 hours, and lowering the temperature at an average temperature-falling speed of at most 10° C./hr to a temperature of at most 700° C.

(28) An EUV mask blank comprising the substrate for an EUV mask blank as defined in any one of the above (1) to (27) and a reflective layer and an absorber layer that are formed on the substrate for an EUV mask blank.

(29) The EUV mask blank according to the above (28), wherein the surface roughness (rms) of the outermost layer of the EUV mask blank is at most 2 nm in the surface quality area.

(30) The EUV mask blank according to the above (28) or (29), wherein the requirement of the uniformity of the peak reflectance of the reflective layer surface in the EUV wavelength region in the entire mask blank, is within ±1.2% in the surface quality area.

(31) An EUV mask comprising the substrate for an EUV mask blank as defined in any one of the above (1) to (27), and a reflective layer and a patterned absorber layer that are formed on the substrate for an EUV mask blank.

(32) The EUV mask according to the above (31), wherein the influence of EUV reflection light from the surface of the absorber layer along the periphery of a mask pattern area is inhibited.

(33) A process for producing semiconductor integrated circuits employing the EUV mask as defined in the above (31) or (32).

The substrate of the present invention has a good flatness, and as a result, it is possible to form a mask suitable for EUV exposure.

According to a preferred embodiment of the substrate of the present invention, it is possible to inhibit the influence of the EUV reflection light from a surface of the absorber layer along the periphery of a mask pattern area.

Figure 1:
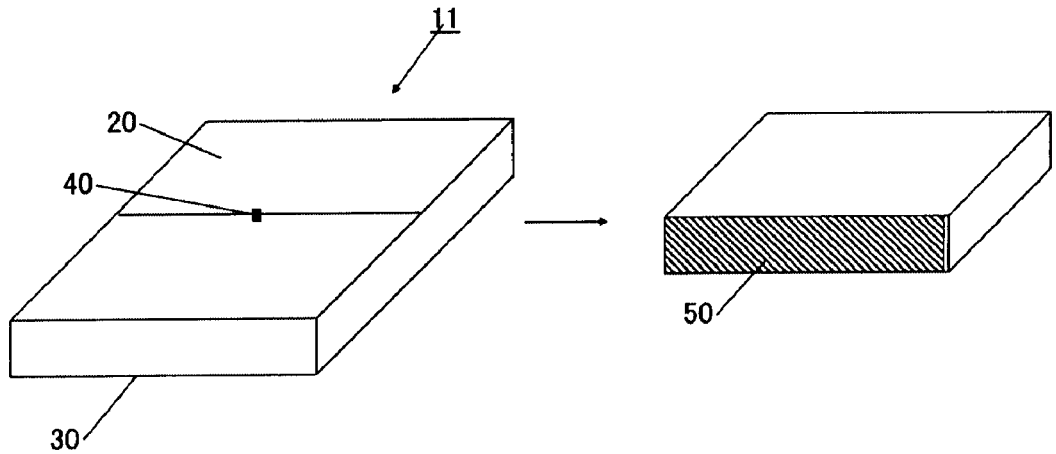
FIG. 1 is a schematic perspective view of an example of a substrate showing a measurement method of a stress in the substrate of the present invention.

EXPLANATION OF NUMERALS 3, 130: reflective layer
4, 140: absorber layer
11, 120: substrate
20: front surface
30: rear surface
40: central point
50: cross section
52: measurement point
54: measurement line
100: EUV mask
150: EUV mask blank
210: mask pattern area
200: EUV light irradiation area
220: area outside mask pattern area

DETAILED DESCRIPTION OF THE PREFERRED EMBODIMENTS

The material of the substrate suitably employed for the present invention is a glass, specifically, a $TiO_2$—$SiO_2$ glass (a silica glass containing $TiO_2$). It is known that the thermal expansion coefficient (CTE) of such a $TiO_2$—$SiO_2$ glass changes according to the concentration of $TiO_2$ contained.

For example, the thermal expansion coefficient of a $TiO_2$—$SiO_2$ glass containing 7 mass % of $TiO_2$ becomes approximately zero at 22° C., and the thermal expansion coefficient of a $TiO_2$—$SiO_2$ glass containing about 7.5 mass % of $TiO_2$ becomes approximately 0 at 50° C. The content of $TiO_2$ is from 1 to 12 mass %. If the content of $TiO_2$ is less than 1 mass %, it may not be possible to achieve zero expansion, and if it exceeds 12 mass %, the thermal expansion coefficient may be negative. The content of $TiO_2$ is preferably from 5 to 9 mass %, more preferably from 6 to 8 mass %.

The chlorine concentration in the $TiO_2$—$SiO_2$ glass is preferably at most 50 ppm, particularly preferably at most 20 ppm, further preferably at most 10 ppm. Particularly, it is preferable that the $TiO_2$—$SiO_2$ glass contains substantially no chlorine. Further, the fluorine concentration in the $TiO_2$—$SiO_2$ glass is preferably at least 100 ppm, particularly preferably at least 200 ppm, further preferably at least 500 ppm. The fluorine concentration is preferably at most 1 mass %. When the fluorine concentration is in the above range, it is possible to reduce the viscosity of the glass.

Further, the boron concentration in the $TiO_2$—$SiO_2$ glass is preferably at least 10 ppb, particularly preferably at least 100 ppb, further preferably at least 1 ppm. The boron concentration is preferably at most 1 mass %. When the boron concentration in the above range, it is possible to reduce the viscosity of the glass.

The $Ti^{3+}$ concentration in the $TiO_2$—$SiO_2$ glass is preferably at most 70 ppm, particularly preferably at most 30 ppm, further preferably at most 10 ppm. By decreasing the $Ti^{3+}$ concentration, it is possible to improve the transmittance at a wavelength of light source employed for flatness measurement, such being preferred.

In a case of conducting EUV lithography, there is a possibility that the dimensions or the shapes of optical components such as mirrors may change according to temperature change caused by EUV exposure. In order to prevent such a change, it is preferred that the temperature in a chamber for exposure be controlled to 22±3° C. Accordingly, since the temperature of the substrate is also controlled to 22±3° C., the COT (that is a crossover temperature at which the thermal expansion coefficient (CTE) becomes 0 ppb/° C.) of the glass as the material of the substrate is preferably 22±3° C. Here, the COT means a COT for a thermal expansion of the entire surface quality area of the substrate. Here, in order to attain a COT of 22±3° C., the content of $TiO_2$ in the substrate is preferably at least 7 mass %.

Here, when the power of exposure light sources is increased for improving throughput in the future, it is expected that it becomes difficult to control the temperature to 22±3° C. and the temperature of the substrate rises. In such a case, the COT of the glass is preferably from 40 to 110° C, more preferably from 45 to 100° C., particularly preferably from 50 to 80° C. In order to attain a COT of from 40 to 110° C., it is preferable that the content of $TiO_2$ in the substrate is at least 7.5 mass %. Further, if the content of $TiO_2$ exceeds 12 mass %, the COT may exceed 110° C., a negative expansion may occur in a temperature range of from −150 to 200° C., separation of crystals of e.g. rutile tends to occur, or bubbles may remain, such being not preferred.

When the $TiO_2$—$SiO_2$ glass is employed as the material for the substrate, it is possible to attain a thermal expansion coefficient of 0±200 ppb/° C., particularly 0±150 ppb/° C., further 0±125 ppb/° C. in a wide temperature range of from 0 to 100° C. Further, when the fictive temperature of the $TiO_2$—$SiO_2$ glass is less than 1,000° C., the temperature region in which the thermal expansion coefficient is approximately zero becomes wide, and it is possible to make the thermal expansion coefficient to be 0±200 ppb/° C. in a temperature range of from −50° C. to 150° C.

During exposure, the temperature of an EUV mask is preferably maintained constant, but slight temperature variation inevitably occurs. Accordingly, in the entire range of the temperature during the exposure, the average thermal expansion coefficient is preferably 0±30 ppb/° C., particularly preferably 0±20 ppb/° C., further preferably 0±15 ppb/° C. Further, the total spatial variation of the thermal expansion coefficient of the substrate is preferably 10 ppb/° C., particularly preferably 6 ppb/° C., further preferably 4 ppb/° C. or 3 ppb/° C. The temperature during the exposure is usually from 19 to 25° C., but as described above, it is expected that the temperature slightly increases in the future, and the temperature may become from 50 to 80° C. Accordingly, within the temperature range of from 19 to 25° C. or from 50 to 80° C., the average thermal expansion coefficient of the substrate is preferably within the above range.

The thermal expansion coefficient can be usually measured within a temperature range of from −150 to +200° C. by using a laser interferometric thermal expansion meter. Measurement of the thermal expansion of the entire surface quality area of the substrate can be achieved, for example, by cutting the substrate into a relatively large glass having a length of about 100 mm, and precisely measuring the thermal expansion in the longitudinal direction by using e.g. a laser heterodyne interferometric thermal expansion meter CTE-01, manufactured by Uniopt. Here, the surface quality area of the substrate will be described later.

Further, measurement of spatial variation of the thermal expansion coefficient of the entire substrate can be achieved by e.g. cutting the substrate into relatively small glass pieces having a size of about 12 mm, and precisely measuring the thermal expansion coefficient of each of these small pieces by using e.g. a laser expansion meter LIX-1, manufactured by ULVAC, Inc. Calculation of the thermal expansion coefficient can be achieved by measuring a dimension change in a range of ±1 to 3° C. centered at a certain temperature, and designating the average thermal expansion coefficient as the thermal expansion coefficient at the medium temperature, or by measuring the dimension change within a relatively wide temperature range of from −150 to +200° C. to obtain a thermal expansion curve, and calculating the temperature differential values of the thermal expansion curve at respective temperatures, and designating these differential values as the thermal expansion coefficients.

The fictive temperature relates to the width of a temperature range (temperature of zero expansion) in which the thermal expansion coefficient is approximately zero. According to the result, when the fictive temperature exceeds 1,200° C., the temperature range of zero expansion is narrow, and such a temperature range may be insufficient for a material to be employed as an EUV mask blank. In order to widen the temperature range of zero expansion, the fictive temperature is preferably less than 1,000° C., particularly preferably less than 950° C., further preferably less than 900° C. or less than 850° C.

In order to obtain a $TiO_2$—$SiO_2$ glass having a fictive temperature of less than 1,000° C., it is effective to use a method of maintaining a formed $TiO_2$—$SiO_2$ glass body formed into a predetermined shape, at a temperature of from 800 to 1,200° C. for 2 hours, and thereafter, lowering the temperature to be at most 700° C. at an average temperature-falling speed of at most 10° C./hr. In order to further lower the fictive temperature, the falling of the temperature is carried out at a speed of preferably at most 5° C./hr, more preferably at a speed of at most 3° C./hr. The slower the average temperature falling speed is, the lower the fictive temperature can be achieved. For example, when the falling of temperature is carried out at a speed of at most 1° C./hr, the fictive temperature may become at most 900° C., and in this case, by falling the temperature at a slow cooling speed such as a speed of at most 1° C./hr only in a temperature region of from 1,000 to 800° C., and cooling the glass at a cooling speed of at least 5° C./hr in other temperature regions, the cooling time can be reduced.

The fictive temperature of the substrate can be measured by a known procedure. With respect to a mirror polished substrate, the absorption spectrum is obtained by employing an infrared spectrometer (Magna 760, manufactured by Nicolet in Examples described later). At this time, the data intervals are set to about 0.5 $cm^{-1}$, and an average value among the values obtained by 64 scans is designated as the absorption spectrum. In an infrared absorption spectrum thus obtained, a peak observed in the vicinity of about 2,260 $cm^{-1}$ derives from a harmonic overtone of expansion/shrinkage vibration of Si—O—Si bond of the $TiO_2$—$SiO_2$ glass. By using the peak position and a standard curve obtained with respect to a glass having a known fictive temperature and having the same composition, the fictive temperature is obtained. As an alternative, the reflection spectrum of the surface is measured by using the same type of infrared spectrometer in the same manner. In an infrared reflection spectrum thus obtained, the peak observed in the vicinity of about 1,120 $cm^{-1}$ is derived from an expansion/shrinkage vibration of a Si—O—Si bond of the $TiO_2$—$SiO_2$ glass. By using the peak position and a standard curve obtained with respect to a glass having a known fictive temperature and having the same composition, the fictive temperature is obtained. Here, a shift of the peak position due to change of the glass composition can be extrapolated from the composition dependence of the standard curve.

The hydrogen molecular concentration in the $TiO_2$—$SiO_2$ glass constituting the substrate of the present invention is preferably at least $5\times10^{16}$ molecules/$cm^3$, particularly preferably at least $8\times10^{16}$ molecules/$cm^3$. By increasing the hydrogen concentration, it is possible to prevent contamination due to carbon produced during exposure and to deoxidize the film formed on the substrate to thereby prevent deterioration of the film due to oxidization. The hydrogen molecular concentration can be measured by Raman spectroscopy.

In a case of producing the $TiO_2$—$SiO_2$ glass of the present invention by a direct method, it is preferred to (1) increase the hydrogen molecular concentration at a time of synthesizing, (2) increase the flame temperature, (3) increase the deposition surface temperature or (4) decrease source gas concentration, as compared with standard synthesizing conditions, to thereby increase the hydrogen molecular concentration. As the combustion gas, one having a molecular formula containing H is employed, but the O/H ratio in all of the gases supplied is preferably at most 1.5, more preferably at most 1.3. The flame temperature is preferably at least 1,900° C., more preferably at least 2,000° C. The deposition surface temperature is preferably at least 1,800° C., more preferably at least 1,900° C. In a pipe for supplying a source gas to a burner, the source gas concentration is preferably at most 20 vol %, more preferably at most 10%. In the above four items, it is preferred that at least two items, more preferably at least three items, particularly preferably all of these items, are carried out.

The OH group concentration of the $TiO_2$—$SiO_2$ glass constituting the substrate of the present invention is preferably at most 600 ppm, more preferably at most 400 ppm, particularly preferably at most 200 ppm. It is considered that when the OH concentration is high, the structural relaxation is quick, and in a case of producing a glass having a large diameter tending to have a temperature distribution, the fictive temperature distribution tends to form.

The OH group concentration is considered to have an influence on the structural relaxation of glass. This is because a OH group becomes a terminal group cutting a network in a network structure of the glass, and as the number of terminal groups is large, the structural relaxation of the glass is considered to be easy. Namely, as the number of OH groups are large, the time required for the structural relaxation becomes short, and the fictive temperature becomes more likely influenced by the temperature distribution in the glass formed during cooling.

As the method for producing a $TiO_2$—$SiO_2$ glass having a low OH group concentration, a soot method is preferred. The soot method is a method of obtaining a transparent $TiO_2$—$SiO_2$ glass body by flame-hydrolyzing or thermally decomposing a Si precursor and a Ti precursor being raw glass-forming materials, to obtain $TiO_2$—$SiO_2$ glass fine particles (soot), depositing the soot, and thereafter, heating the soot to a transparent vitrification temperature to obtain a transparent $TiO_2$—$SiO_2$ glass body. Further, the soot method includes an MCVD method, an OVD method, a VAD method, etc. in terms of the production process. The method will be described in detail later.

Further, another method may be a method of producing a glass body by a direct method that is described in Patent Document 4. Specifically, a supplied raw material containing silicon and a supplied raw material containing titanium are flame-hydrolyzed to produce a silica-titania powder, and the powder is deposited on a rotating collecting cup disposed in a refractory furnace or on a surface of a glass present in the furnace, to consolidate the powder to form a $TiO_2$—$SiO_2$ glass. The substrate of the present invention can be produced by the soot method or the direct method. Further, it can be produced by a so-called melting method that is another production method.

The OH group concentration can be measured by the following procedure. The absorption spectrum of the $TiO_2$—$SiO_2$ glass is measured by an infrared spectrometer, the absorption peak at a wavelength of 2.7 μm in the spectrum was obtained, and based on the peak, the OH group concentration is obtained. The detection limit of this method is usually about 0.1 ppm.

In the substrate of a mask for EUV, the $TiO_2/SiO_2$ composition ratio in the glass is preferably constant for the reason that the distribution of the thermal expansion coefficient in the substrate becomes small. A variation in the $TiO_2/SiO_2$ composition ratio has an influence on the refractive index of the glass, and accordingly, the variation width Δn of the refractive index can be used as an index of the uniformity of $TiO_2$—$SiO_2$ composition. In the substrate of the present invention, the variation width (Δn) of the refractive index in an area of 30 mm×30 mm in at least one surface is preferably at most $4×10^{-4}$ (400 ppm). If it exceeds $4×10^{-4}$, the surface roughness after polishing becomes large, and ultrahigh smoothness may not be obtained. The variation width is preferably at most $3.5×10^{-4}$ (350 ppm), more preferably at most $3×10^{-4}$ (300 ppm). Particularly, in order to achieve ultra smoothness (surface roughness (rms)≦2 m), the variation width (Δn) of the refractive index is preferably at most $2×10^{-4}$ (200 ppm), more preferably at most $1'10^{-4}$ (100 ppm), particularly preferably at most $0.5×10^{-4}$ (50 ppm).

The measurement method of the variation width Δn of the refractive index may be a known method such as a method of using an optical interferometer. More specifically, from a transparent $TiO_2$—$SiO_2$ glass body, e.g. a cube of about 40 mm×40 mm×40 mm is cut out, and from each surface of the cube, a plate of about 0.5 μm thick was sliced and polished to obtain a plate-shaped $TiO_2$—$SiO_2$ glass block of 30 mm×300 mm×(0.2 to 1) mm is obtained. By using a Fizeau interferometer having a small aperture, a surface of 30 mm×30 mm of the glass block is irradiated with e.g. a laser beam of 650±10 nm, and the interferometric image is expanded to a magnification at which a striae is sufficiently observable, to check the refractive index distribution in the surface to thereby measure the variation width An of the refractive index. When the pitch of the striae is small, it is preferable to reduce the thickness of the plate-shaped $TiO_2$—$SiO_2$ glass block to be measured.

In the substrate obtainable by the present invention, when the variation of the fictive temperature is within 100° C. and the variation of the OH group concentration is within 50 ppm and Δn is within $4×10^{-4}$, it is possible to make the thermal expansion coefficient to be within 30 ppb/° C. in an area of about 30 mm×about 30 mm on at least one surface, and the substrate is extremely suitable as a mask for EUV.

The variation in the fictive temperature means the difference between the maximum value and the minimum value of the fictive temperature in an area of 30 mm×30 mm in one surface. The variation of the fictive temperature can be measured as follows. A transparent $TiO_2$—$SiO_2$ glass body formed into a predetermined size is sliced to obtain a $TiO_2$—$SiO_2$ glass block of 50 mm×50 mm×1 mm. With respect to a surface of 50 mm×50 mm of the $TiO_2$—$SiO_2$ glass block, measurement of the fictive temperature is carried out according to the above-mentioned method at intervals of 10 mm, to find the variation of the fictive temperature of the formed $TiO_2$—$SiO_2$ glass body.

In order to produce a $TiO_2$—$SiO_2$ glass to be employed for an embodiment of the substrate of the present invention, the following production process can be employed.

Step (a)

A silica precursor and a titania precursor, which are glass-forming materials, are flame-hydrolyzed to obtain $TiO_2$—$SiO_2$ glass fine particles, and they are deposited and grown on a substratum to form a porous $TiO_2$—$SiO_2$ glass body. The glass-forming materials are not particularly limited so long as they can be gases, but the silica precursor may, for example, be a silicon halide compound, for example, as a chloride such as $SiCl_4$, $SiHCl_3$, $SiH_2Cl_2$ or $SiH_3Cl$, a fluoride such as $SiF_4$, $SiHF_3$ or $SiH_2F_2$, a bromide such as $SiBr_4$ or $SiHBr_3$, or an ionide such as $SiI_4$; or an alkoxysilane represented by $R_nSi(OR)_{4-n}$ (wherein R is an alkyl group containing 1 to 4 carbon atoms, n is an integer of from 0 to 3). Further, the titania precursor may be a titanium halide compound such as $TiCl_4$ or $TiBr_4$, or an alkoxytitanium represented by $R_nTi(OR)_{4-n}$ (wherein R is an alkyl group containing 1 to 4 carbon atoms, n is an integer of from 0 to 3). Further, as the silica precursor and the titania precursor, a mixed compound of Si and Ti such as silicon titanium double alkoxide may be used.

As the substratum, a seed rod made of a quartz glass (such as a seed rod described in Patent Document 7) may be employed. Further, instead of a rod-shaped substratum, a plate-shaped substratum may be employed. At a time of supplying a raw glass-forming material, the temperatures of a raw material tank or a raw material gas pipe and the gas flow rate are preferably precisely controlled for the purpose of stabilizing supply of the raw glass material gas. Further, a stirring mechanism of the glass raw material gas is preferably provided in the gas supplying system. By the above method, it is possible to reduce the striae level of the $TiO_2$—$SiO_2$ glass to reduce the striae stress level and the refractive index variation width to predetermined values or less, such being preferred.

Besides the above stabilization of supply of raw materials, the rotational speed of the seed rod at the time of forming a porous $TiO_2$—$SiO_2$ glass body is preferably at least 25 rpm, more preferably at least 50 rpm, further preferably at least 100 rpm, particularly preferably at least 250 rpm. Besides the stabilization or homogenization of the supply of the raw materials in vapor form, high speed rotation of the seed rod makes it possible to obtain a $TiO_2$—$SiO_2$ glass having further small striae.

Step (b)

The porous $TiO_2$—$SiO_2$ glass body obtained by Step (a) is heated to a densification temperature in a reduced pressure atmosphere or a helium atmosphere to obtain a $TiO_2$—$SiO_2$ dense body. The densification temperature is usually from 1,250 to 1,550° C., particularly preferably 1,300 to 1,500° C. The densification temperature is a temperature at which the porous glass body can be densified until no pore is recognized by an optical microscope.

Step (c)

The $TiO_2$—$SiO_2$ dense body obtained by Step (b) is heated to a transparent vitrification temperature to obtain a transparent $TiO_2$—$SiO_2$ glass body. The transparent vitrification temperature is preferably from 1,350 to 1,800° C., particularly preferably from 1,400 to 1,750° C. The transparent vitrification temperature means a temperature at which a transparent glass in which no crystal is observable by an optical microscope, can be obtained.

The atmosphere for the heating is preferably an atmosphere of 100% inert gas such as helium or argon, or an atmosphere containing as the main component an inert gas such as helium or argon. He pressure may be a reduced pressure or a normal pressure. In a case of a reduced pressure, the reduced pressure is preferably at most 13,000 Pa.

Step (d)

The transparent $TiO_2$—$SiO_2$ glass body obtained by Step (c) is heated to a temperature of at least a softening point to form the glass body into a desired shape, to obtain a formed $TiO_2$—$SiO_2$ glass body. The temperature for the forming is preferably from 1,500 to 1,800° C. If the temperature is lower than 1,500° C., since the viscosity of the transparent $TiO_2$—$SiO_2$ glass is high, no substantial deformation occurs by its own weight, and the growth of cristobalite being a crystal phase of $SiO_2$ or the growth of rutile or anatase being a crystal phase of $TiO_2$ occurs, which may cause a so-called divitrification. If the temperature exceeds 1,800° C., sublimation of $SiO_2$ may not be neglectable.

Further, in order to improve the stress value, the following two-step forming is preferably carried out. Firstly, the transparent $TiO_2$—$SiO_2$ glass body is heated to the above forming temperature to form a first formed body, and thereafter, the outer periphery of the substrate is cut. The first formed body from which the outer periphery is cut is heated to the forming temperature to form it into a second formed body. This two-step forming is preferred for the reason that the intervals of striae can be reduced to increase the gradient of concentration, to thereby facilitate diffusion of components between striaes. Further, adjustment is possible so that the outer periphery becomes a portion having a large stress of striae present inside the glass body, such being preferred. The volume of the first formed body is preferably at most ¾ of the volume of the second formed body.

Here, Step (c) and Step (d) may be carried out continuously or simultaneously.

Step (e)

The formed $TiO_2$—$SiO_2$ glass body obtained by Step (d) is subjected to an annealing treatment. Specifically, an annealing treatment is carried out, in which the glass body is heated at a temperature of from 800 to 1,200° C. for at least 1 hour, and the temperature is lowered to at most 700° C. at an average temperature falling speed of at most 10° C./hr, to control the fictive temperature of the $TiO_2$—$SiO_2$ glass. As an alternative, an annealing treatment is carried out, in which the formed $TiO_2$—$SiO_2$ glass body obtained by Step (d) and having a temperature of at least 1,200° C. is cooled to 700° C. at an average temperature-falling speed of at most 60° C./hr, to control the fictive temperature of the $TiO_2$—$SiO_2$ glass. After the temperature is lowered to at most 700° C., the glass body is left for cooling. The atmosphere for the leaving for cooling is preferably an atmosphere of 100% inert gas such as helium, argon or nitrogen, or an atmosphere containing as the main component such an inert gas, or an atmosphere of atmospheric air. The pressure for the leaving for cooling is preferably a reduced pressure or a normal pressure.

Step (f)

The $TiO_2SiO_2$ glass body obtained by Step (e) is heated at from 300 to 1,200° C for at least 10 hours under a hydrogen atmosphere to obtain a $TiO_2$—$SiO_2$ glass body containing hydrogen. The atmosphere is preferably an atmosphere of 100% hydrogen or a hydrogen atmosphere containing an inert gas such as helium or argon, and the hydrogen partial pressure is preferably at least 0.1 atm, more preferably at least 1 atm, further preferably at least 5 atom. In order to improve the distribution of hydrogen concentration, the duration is preferably at least 10 hours, more preferably at least 24 hours.

In order to achieve a lower fictive temperature, it is effective to cool the glass body at a lower cooling speed in a temperature region in the vicinity of the annealing point or the strain point of the glass. Specifically, in the cooling profile of Step (e), the slowest cooling speed is preferably at most 10° C./hr, more preferably at most 5° C./hr, further preferably at most 3° C./hr, particularly preferably at most 1° C./hr.

The $TiO_2$—$SiO_2$ glass of the present invention preferably has no inclusion. The inclusion means foreign substances or bubbles present in a glass. The foreign substances may be caused by contamination in the glass-producing step or crystal separation. In order to eliminate the inclusion such as foreign substances or bubbles, in the above production process, it is preferred to control contamination particularly in Step (a) and to accurately control temperature conditions in steps (b) to (d).

The $TiO_2$—$SiO_2$ glass body formed by the above process is roughly cut in a substrate size to form a pre-treatment substrate. Next, in order to roughly polish the pre-treatment substrate, mechanical grinding is carried out. Thereafter, precision polishing and cleaning described in Patent Documents 8 and 9 are carried out to produce a substrate before film deposition. The substrate of the present invention usually means a substrate before film deposition.

As described above, by any one of the soot method and the direct method, it is possible to produce a substrate made of $TiO_2$—$SiO_2$ as an embodiment of the present invention can be produced. When a $TiO_2$—$SiO_2$ glass is produced by any of these methods, striae may be formed in the glass in many cases. The striae is a defect appearing in a streak shape in a glass, which is usually easily observable when the glass is sliced and polished. The cause of the striae is mainly unevenness in $TiO_2$ concentration in the glass, and the state of accurance changes depending on the production process or the production conditions, and accordingly, the nature of striae differs between substrates. Further, in a case of producing a substrate for EUV, usually, a glass body larger than the substrate is formed, and the glass body is cut into a plurality of substrates in most cases. Accordingly, the number or the intensity of the striae portions in the substrate usually differs between substrates.

The intensity of striae in a substrate can be evaluated by measuring a stress by the following method. From now, explanation will be made with reference to FIGS. 1 and 2. Firstly, a substrate 11 is prepared. This substrate may be a substrate before film deposition or a substrate from which deposited films are removed. The substrate 11 has a front surface 20 (a surface on which a reflective layer and an absorber layer are to be deposited) and a rear surface 30 (a surface on which a high dielectric coating is formed). Next, the substrate is cut along a line passing through the central point of the front surface 20 and parallel with one of the sides of the substrate. Accordingly, a cross section 50 through the center of the substrate appears. The cross section is polished, and while the polished surface is perpendicularly irradiated with light having a predetermined wavelength, an observation region is observed by using a birefringent microscope with a magnification so that a striae is sufficiently observable, to thereby measure a retardation (optical path difference) at a predetermined measurement point. The retardation (optical path difference) obtained is converted to a stress by the following formula (1).

$$\Delta = C \times F \times n \times d \quad (1)$$

Here, $\Delta$ is a retardation, C is an optelastic coefficient, F is a stress, n is a refractive index, and d is the thickness of a sample. C and d are determined by the type of glass, and the thickness d of the sample can be made constant, whereby the stress can be converted from the retardation.

Since the stress changes depending on the position of the substrate, it is not preferable to use a measurement value of a single point as the representing value. For this reason, the measurement area of the stress is set to 3.4 mm×2.5 mm (hereinafter this area is referred to as a specific measurement area), and within this area, the stress is measured randomly at a million points and based on this large number of measurement values, the standard deviation ($\sigma$) or the maximum variation (PV) of the stress in the specific measurement area can be obtained. Here, since the striae is measured by transmission light, the thickness of the measurement sample of the substrate is reduced to about 1 mm for measurement in many cases.

Figure 2:
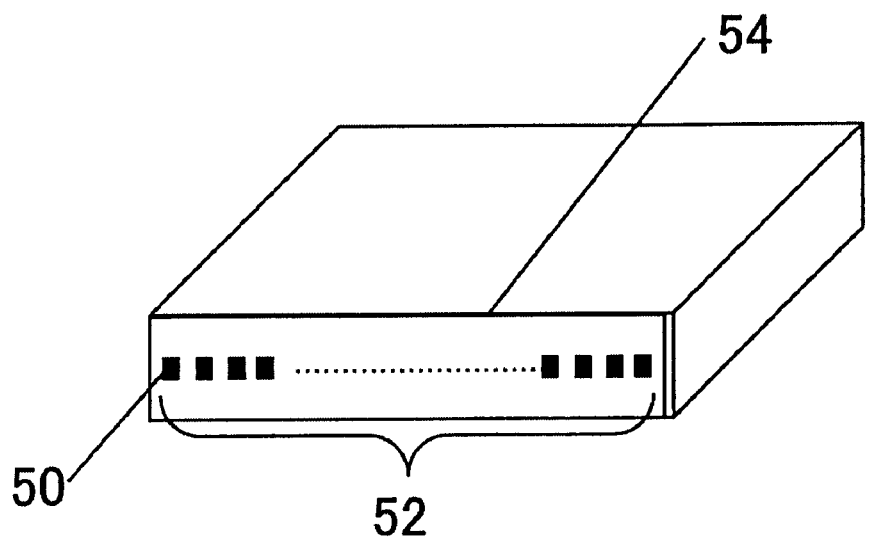
FIG. 2 is a schematic perspective view of an example of measurement points of the stresses in a cross section of the substrate of the present invention.

Next, in order to evaluate the distribution of the intensity of striae in the entire substrate, that is, in order to evaluate the distribution of the standard deviation ($\sigma$) of the stress or the distribution of the maximum variation (PV) of the stress in the substrate, the number of the specific measurement areas is increased to achieve these evaluations. In the present invention, as shown in FIG. 2, as measurement points 52 as the center points of measurement positions in the respective specific measurement areas, total 44 points are selected at intervals of about 3.4 mm along a line in parallel with surfaces (front surface and rear surface) of the substrate through the central point in the cross-sectional direction, and within each specific measurement area centering each measurement point, the stress measurement is carried out.

Here, when the intensity of striae is measured, the intensity of striae is obtained as the average value in the thickness direction of a measurement portion, which is not the strength of striae of a surface to be actually used, strictly speaking. However, by measuring in the vicinity of the surface to be actually used, it is possible to consider the measurement result as the intensity of striae of the surface to be used. Further, in this method, the distribution of the intensity of striae can be measured only along one direction of the substrate, but considering the production process of glass, striae usually changes continuously, it is possible to estimate the distribution of the intensity of striae in the entire substrate to a certain extent. Further, by carrying out such measurement along a plurality of directions or by carrying out the measurement considering the direction of axis symmetry or point symmetry, it is possible to estimate the distribution of the intensity of striae more precisely.

The standard deviation ($\sigma$) of the stress of the substrate of the present invention is preferably at most 0.04 MPa in the surface quality area. If it exceeds 0.4 MPa, the variation in the surface roughness in the entire surface becomes extremely large, and it becomes extremely difficult to set polishing conditions at a time of carrying out polishing, and as a result, it may become difficult to achieve ultrahigh smoothness on the substrate surface. The standard deviation is more preferably at most 0.03 MPa, further preferably at most 0.02 MPa, particularly preferably at most 0.15 MPa.

Here, the phrase "within the surface quality area" means "within an area at least 5 mm inside from the edge of the substrate", that specifically means "at all measurement points except measurement points No. 1 and No. 44 that are the outermost points". Meanwhile, a portion less than 5 mm from the edge of the substrate is designated as "outside the surface quality area".

Since a striae usually continuously changes, it is possible to estimate the distribution of the intensity of striae in the entire substrate to some extent also by this method. Here, the standard deviation ($\sigma$) of stress in this specification means the maximum value of the standard deviations measured in the specific areas.

The maximum variation (PV) of the stress of the substrate of the present invention, is preferably at most 0.2 MPa within the surface quality area. If it exceeds 0.2 MPa, the distributions of mechanical and chemical properties of the glass in the entire glass become large, and as a result, polishing rate does not become constant, the roughness of a surface after polishing becomes large, and the ultrahigh smoothness of the substrate surface may not be achieved. The maximum variation is more preferably at most 0.15 MPa, further preferably at most 0.13 MPa, particularly preferably at most 0.1 MPa. The standard deviation (PV) of the stress has a correlation with the surface roughness of the substrate, and in order to improve the surface roughness, this value is preferably a good value to some certain extent. In order to improve the value of the above-mentioned striae, it is one of the important points to adjust the angle of a burner for producing a glass body.

Here, the maximum variation (PV) of stress in this specification means the maximum value among values measured in the specific areas.

The root mean square (rms) of the stress of the substrate of the present invention is preferably at most 0.05 MPa at all points in the effective surface. If it exceeds 0.5 MPa, the surface roughness after polishing increases, and it may not be able to achieve ultrahigh smoothness. It is preferably at most 0.04 MPa, further preferably at most 0.03 MPa, particularly preferably at most 0.015 MPa.

In the above description, the standard deviation ($\sigma$) of the stress of the substrate and the maximum variation (PV) of the stress of the substrate within the surface quality area are described, but even outside the surface quality area, the standard deviation ($\sigma$) of the stress of the substrate and the maximum variation (PV) of the stress of the substrate preferably satisfy the specific conditions. The following description discusses this point.

In an EUV lithography, exposure light is not incident in a perpendicular direction to an EUV mask but incident in a direction a few degrees, usually 6 degrees, tilted from the perpendicular direction. When the film thickness of the absorber layer is thick, a mask pattern produced by removing a part of the absorber layer by etching forms a shadow of exposure light at the time of EUV lithography, which tends to deteriorate pattern accuracy or dimension accuracy of a mask pattern (hereinafter referred to as "transferred pattern") transferred to a resist on a substrate such as a Si wafer by using the EUV mask. This problem becomes more significant as the line width of a mask pattern formed on the EUV mask becomes small, and accordingly, it is preferred to reduce the film thickness of the absorber layer of the EUV mask blank. However, it is a matter of course that in order to maintain the absorptivity of EUV light, the absorber layer has preferably at least a certain degree of film thickness.

For the absorber layer of EUV mask blank, a material having a high absorption coefficient for EUV light is employed, and the film thickness is preferably selected so that EUV light incident into a surface of the absorber layer is completely absorbed into the absorber layer. However, as described above, since the film thickness of the absorber layer is required to be thin, it is not possible to completely absorb the incident EUV light into the absorber layer, and part of the light becomes reflection light.

What is required at a time of forming a transcription pattern on a resist on a substrate by EUV lithography, is the optical contrast of reflection light from the EUV mask, that is, the optical contrast between reflection light from a portion in which the absorber layer is removed at a time of mask-patterning to expose a reflective film, and reflection light from a portion in which the absorber layer is not removed at the time of mask-patterning. Accordingly, it has been considered that so long as a sufficient optical contrast of reflection light is obtained, there is no problem even if the incident EUV light is not completely absorbed into the absorber layer.

In Patent Document 2, based on such a concept, in order to reduce the film thickness of the absorber layer, an EUV mask using the principle of phase shift is proposed. This mask is characterized in that a portion in which the absorber layer is not removed at a time of mask-patterning has a reflectance of from 5 to 15% for EUV light (reflection light) and that the reflection light has a phase difference of from 175 to 185 degrees with respect to EUV reflection light from a portion in which the absorber layer is removed at the time of mask-patterning to expose the reflective film. In this EUV mask, it is possible to maintain a sufficient optical contrast between reflection light from the absorber layer and reflection light from the reflective film by using the principle of phase shift, and it is possible to reduce the film thickness of the absorber layer according to Patent Document 2.

Figure 17:
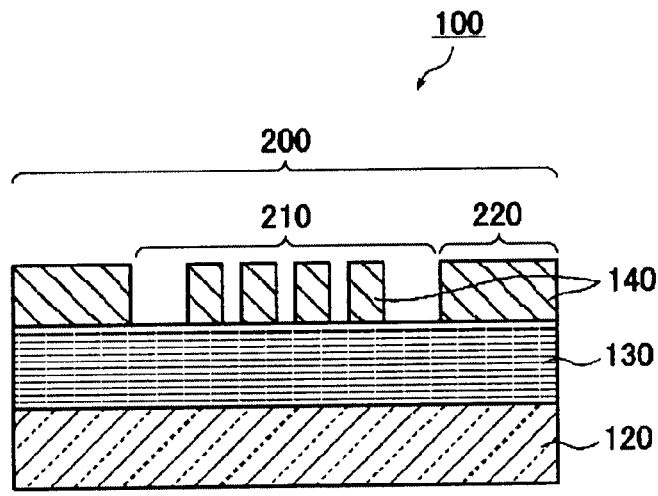
FIG. 17 is a cross-sectional schematic view of an example of a mask for explaining the influence of EUV reflection light from the outer periphery of a mask pattern area.

However, in the EUV mask using the principle of phase shift, although there is no problem with respect to the actual mask pattern area (an area in which mask patterns are formed and which is used for transferring the patterns at a time of EUV lithography), it is not possible to use the principle of phase shift for reflection light from the outside of the mask pattern area, and the optical contrast between such reflection light and reflection light from the reflective film may become insufficient. Explanation will be made with respect to this point using FIG. 17. FIG. 17 is a schematic cross-sectional view showing an example of EUV mask after a mask pattern is formed, which shows a substrate 120, a reflective film 130 and an absorber layer 140 formed on the substrate in this order, and a mask pattern is formed in a mask pattern area 210 by partially removing the absorber layer 140.

With respect to the mask pattern area 210 of an EUV mask 100 shown in FIG. 17, by the above-mentioned principle of phase shift, the optical contrast between reflection light from the surface of reflective film 120 and reflection light from the surface of absorber layer 130 can be sufficiently maintained. However, the actual exposure area, which is irradiated with EUV light, is the area of 200. Accordingly, EUV light is also incident into an area (an outer peripheral portion of mask pattern area) designated as 220 outside the mask pattern area 210, but at this time, the effect of phase shift from reflection light from the reflective film 130, is not sufficiently obtained, and about from 5 to 15% of reflection occurs on the surface of the absorber layer 140. As a result, this EUV reflection light of from 5 to 15% is incident into a resist on a Si substrate, and an unnecessary exposure of resist may occur. Particularly, at a time of carrying out an overlay exposure, such unnecessary exposure of resist may be a problem.

In order to prevent exposure of a resist by EUV reflection light from the outer periphery of the mask pattern area, in the substrate of the present invention, the standard deviation ($\sigma$) of the stress outside the surface quality area is preferably more than 0.05 MPa. If the standard deviation ($\sigma$) of the stress exceeds 0.05 MPa, when the reflective layer and the absorber layer are formed on the substrate, the flatness of the reflective layer along the outer periphery of the mask pattern area is deteriorated, the reflectance decreases and the influence of EUV light from the surface of the absorber layer along the outer periphery of the mask pattern area, is inhibited, such being preferred.

The standard deviation is more preferably at least 0.052 MPa, further preferably at least 0.055 MPa, or at least 0.07 MPa. The standard deviation ($\sigma$) of the stress outside the surface quality area is preferably at most 5 MPa.

Further, in order to prevent exposure of a resist by EUV reflection light from the outer periphery of the mask-patterning area, in the substrate of the present invention, the maximum variation (PV) of the stress outside the surface quality area preferably exceeds 0.2 MPa. If the maximum variation (PV) of the stress exceeds 0.2 MPa, when the reflective layer and the absorber layer are formed on the substrate, the flatness of the reflective layer in the outer periphery of the mask pattern area is deteriorated, the reflectance decreases and the influence of EUV reflection light from the surface of the absorber layer along the outer periphery of the mask pattern area is inhibited, such being preferred. The maximum variation is more preferably at least 0.25 MPa, further preferably at least 0.3 MPa, particularly preferably at least 0.35 MPa or at least 0.5 MPa. The maximum variation (PV) of the stress outside the surface quality area is preferably at most 10 MPa.

However, the maximum variation (PV) of the stress and the standard deviation ($\sigma$) of the stress relate to the surface roughness of the substrate, and in order to improve the surface roughness of the substrate, in the surface quality area of the substrate, these values are preferably good values to some certain extent, and these values preferably satisfy the following range as described above.

The standard deviation ($\sigma$) of the stress of the substrate in the surface quality area is preferably at most 0.04 MPa, more preferably at most 0.03 MPa, further preferably at most 0.02 MPa, particularly preferably at most 0.15 MPa.

The maximum variation (PV) of the stress of the substrate in the surface quality area is preferably at most 0.2 MPa, more preferably at most 0.15 MPa, further preferably at most 0.13 MPa, particularly preferably at most 0.1 MPa.

Accordingly, the standard deviation (σ) of the stress outside the surface quality area of the substrate of the present invention is preferably by at least 0.02 MPa larger than the standard deviation (σ) of the stress in the surface quality area. The difference is particularly preferably at least 0.025 MPa, further preferably at least 0.04 MPa.

In the same manner, the maximum variation (PV) of the stress outside the surface quality area of the substrate of the present invention is by at least 0.1 MPa larger than the maximum variation (PV) in the surface quality area. The difference is particularly preferably at least 0.15 MPa, further preferably at least 0.3 MPa.

The surface roughness (rms) of the substrate of the present invention is at most 2 nm, preferably at most 1.5 nm, further preferably at most 1 nm in the surface quality area in terms of MSFR (mid-spatial frequency roughness) having a waviness pitch within a range of from 10 μm to 1 mm being an index of smoothness in a polished surface, for the purpose of obtaining a high performance EUVL mask blank. When the value of surface roughness in the entire substrate is at most 100 nm, it becomes possible to achieve uniform patterning of a film formed on the substrate, and it becomes possible to form a good mask. In this specification, "surface roughness" means the square mean root (rms) of irregularities in an area of 1 mm$^2$, and "surface roughness in the entire substrate" means the highest value among the values of measured surface roughnesses of respective points along the measurement line 54 in FIG. 2.

There is also a case where a surface roughness measured only at one point in the substrate surface is designated as the representative value of the substrate. However, when the surface roughness of the substrate influences the reflectance distribution or the surface roughness distribution of a film (reflective film or absorber film) formed on the substrate, one point evaluation of the surface roughness is insufficient, and it is preferred to measure the surface roughness over the entire substrate. The surface roughness may be measured, for example, by a non-contact surface topography measurement tool (e.g. New View manufactured by ZYGO) using a scanning type interferometer. Here, the substrate usually has a size of about 6 inches (about 152 mm)×about 6 inches (about 152 mm)×about 6.35 mm.

Here, as a process for producing $TiO_2$—$SiO_2$ glass, a melting method is mentioned, according to which a natural raw material or a synthesized raw material is melted by an oxygen-hydrogen flame or an electric furnace to produce the glass. However, also in such a melting method, heterogeneity according to the grain size of the raw material may occur in the same manner as striae, to deteriorate surface smoothness.

In the substrate of the present invention, it is preferred that no pit in concave form of at least 60 nm is present on a surface in the surface quality area. If a defect having a size of at least 60 nm is present in the surface quality area, the smoothness of the reflective layer is deteriorated, and the reflectance decreases, such being not preferred. The defects include those of convex type and concave type, but convex defects are caused by adhesion of foreign substances that can be removed by repolishing or removed by cleaning and they do not tend to cause a problem. However, concave defects, that are concave pits, are recesses, which are not easily removable by cleaning. In a case where polishing is continued in such a manner to produce concave pits, even if a concave pit at a particular position is removed, other pits may be formed in other portions, and they tend to cause problems as compared with convex defects. In order to avoid generation of concave pits, it is preferred to improve homogeneity of glass to prevent unnecessary uneven polishing and to control the particle size of polishing abrasive particles to prevent intermixture of unnecessary foreign substances. Considering the quality of mask, it is more preferable that no concave pit of at least 40 nm is present on a surface in the surface quality area.

The polishing method of the substrate of the present invention can be selected from a wide range of known polishing methods used for polishing surfaces of quartz glass materials. However, for the reasons of large polishing rate and a capability of polishing a large surface area at one time by using a polishing pad having a large surface area, a mechanical polishing method is usually employed. The mechanical polishing method includes not only a method of polishing only by a polishing function of abrasive particles but also a method using a combination of the polishing function of abrasive particles and a chemical polishing function of a chemical by using a polishing slurry. Here, the mechanical polishing method may be lapping or polishing, and polishing tools and polishing agents to be used can be appropriately selected from known items. Here, in a case of using the mechanical polishing methods, in order to increase the polishing rate, a lapping is preferably carried out with a contact pressure of from 30 to 70 gf/cm$^2$, more preferably with a contact pressure of from 40 to 60 gf/cm$^2$, and a polishing is preferably carried out with a contact pressure of from 60 to 140 gf/cm$^2$, more preferably with a contact pressure of from 80 to 120 gf/cm$^2$. The polishing amount is preferably from 100 to 300 μm in the case of lapping and preferably from 1 to 60 μm in the case of polishing.

The polishing step is preferably carried out at a plurality of times. Specifically, the polishing step preferably includes a first polishing, a second polishing and a third polishing. Further, the final polishing preferably uses a polishing agent containing colloidal silica as the main component, and a polishing just before the polishing using colloidal silica preferably uses a polishing agent containing a cerium oxide as the main component.

Figure 3:
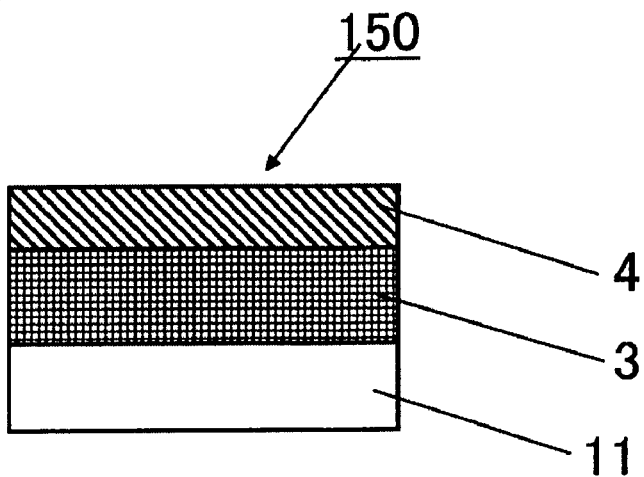
FIG. 3 is a cross-sectional schematic view of an example of a blank having the substrate of the present invention.

An EUV blank 150 of the present invention comprises, as shown in FIG. 3, a substrate 11, a reflective layer 3 for reflecting UV light and an absorber layer 4 for absorbing UV light.

The reflective layer 3 is not particularly restricted so long as it is one having desired characteristics as a reflective layer for an EUV mask blank. Here, the characteristic particularly required for the reflective layer 3 is a high EUV light reflectance. Specifically, when the surface of the reflective layer 3 is irradiated at an incident angle of 6° with light in a wavelength region of EUV light, the maximum value of the light reflectance in the vicinity of a wavelength of 13.5 nm is preferably at least 60%, more preferably at least 65%. Even in a case where a protective layer or a low reflection layer is formed on the reflection layer 3, the maximum value of the light reflectance in the vicinity of a wavelength of 13.5 nm is preferably at least 60%, more preferably at least 65%.

As the reflective layer 3, a reflective multilayer film having high refractive index layers and low refractive index layers alternately stacked in a plurality of times, is usually used as the reflective layer 3, whereby a high EUV light reflectance can be attained. In the reflective multilayer film constituting the reflective layer 3, Mo is widely used for the high refractive index layers, and Si is widely used for the low refractive index layers. Namely, a reflective Mo/Si multilayer film is most common. However, the reflective multilayer film is not limited thereto, and a reflective Ru/Si multilayer film, a reflective Mo/Be multilayer film, a reflective Mo compound/Si compound multilayer film, a reflective Si/Mo/Ru multilayer film, a reflective Si/Mo/Ru/Mo multilayer film or a reflective Si/Ru/Mo/Ru multilayer film may also be used.

The thicknesses of the respective layers and the number of repeating layer units constituting the reflective multilayer film constituting the reflective layer 3 may suitably be selected depending upon the film materials to be used and the EUV light reflectance required for the reflective layer. When a reflective Mo/Si multilayer film is taken as an example, in order to form a reflective layer 12 having the maximum value of the EUV light reflectance being at least 60%, the reflective multilayer film may be formed by stacking Mo layers having a thickness of 2.3±0.1 nm and Si layers having a thickness of 4.5±0.1 nm so that the number of repeating units will be from 30 to 60.

Here, the respective layers constituting the reflective multilayer film as the reflective layer 3 may be formed to have the desired thickness by means of a well-known film deposition method such as magnetron sputtering or ion beam sputtering. For example, in a case where a reflective Si/Mo multilayer film is formed by means of ion beam sputtering, it is preferred that a Si film is deposited to have a thickness of 4.5 nm at an ion-accelerated voltage of from 300 to 1,500 V at a film deposition rate of from 0.03 to 0.30 nm/sec by using a Si target as the target and using an Ar gas (gas pressure: $1.3 \times 10^{-2}$ Pa to $2.7 \times 10^{-2}$ Pa) as the sputtering gas, and then a Mo film is deposited to have a thickness of 2.3 nm at an ion-accelerated voltage of from 300 to 1,500 V at a film deposition rate of from 0.03 to 0.30 nm/sec by using a Mo target as the target and using an Ar gas (gas pressure: $1.3 \times 10^{-2}$ Pa to $2.7 \times 10^{-2}$ Pa) as the sputtering gas. This operation is regarded as one cycle, and by stacking Si films and Mo films for 40 to 50 cycles, a reflective Si/Mo multilayer film will be formed.

In order to prevent oxidation of the surface of the reflective layer 3, the uppermost layer of the reflective multilayer film constituting the reflective layer 3 is preferably a layer made of a hardly oxidizable material. The layer made of a hardly oxidizable material will function as a cap layer of the reflective layer 3. As a specific example of the layer made of a hardly oxidizable material functioning as cap layer, a Si layer may, for example, be mentioned. In a case where the reflective multilayer film constituting the reflective layer 3 is a Si/Mo film, the uppermost layer may be made to be a Si layer, so that the uppermost layer will function as a cap layer. In such a case, the thickness of the cap layer is preferably 11±2 nm.

A protective layer may be provided between the reflective layer 3 and the absorber layer 4. The protective layer is provided for the purpose of protecting the reflective layer 3, so that the reflective layer 3 will not receive a damage by an etching process at the time of forming a pattern in the absorber layer 4 by an etching process, usually by a dry etching process. Accordingly, as the material for the protective layer, a material is selected which is hardly susceptible to an influence by the etching process of the absorber layer 4, i.e. a material having an etching rate slower than the absorber layer 4 and yet is hardly susceptible to a damage by such an etching process. A material which satisfies such conditions, may, for example, be Cr, Al, Ta or their nitrides, Ru or a Ru compound (such as RuB or RuSi) as well as $SiO_2$, $Si_3N_4$, $Al_2O_3$ or a mixture thereof. Among them, at least one of Ru, a Ru compound (such as RuB or RuSi), CrN and $SiO_2$ is preferred, and Ru or a Ru compound (such as RuB or RuSi) is particularly preferred. In a case of providing the protective layer, the thickness is preferably from 1 to 60 nm.

In a case of providing the protective layer, the protective layer is formed by using a well-known film deposition method such as magnetron sputtering or ion beam sputtering. In a case where a Ru film is formed by magnetron sputtering, it is preferred to carry out film deposition at an applied electric power of from 30 W to 500 W at a film deposition rate of from 0.02 to 1.0 nm/min so that the thickness will be from 2 to 5 nm by using a Ru target as the target and using an Ar gas (gas pressure: $1.0 \times 10^{-1}$ Pa to $10 \times 10^{-1}$ Pa) as the sputtering gas.

The property particularly required for the absorber layer 4 is to sufficiently increase the contrast of reflection light with respect to the reflective layer 3 or with respect to the protective layer when the protective layer is formed on the reflective layer 3.

In this specification, the contrast of reflection light is obtainable by using the following formula.

$$\text{Contrast (\%) of reflection light} = ((R2-R1)/(R2+R1)) \times 100$$

Figure 4:
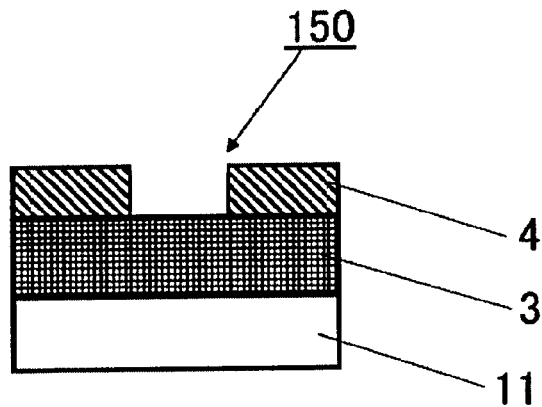
FIG. 4 is a view similar to FIG. 3, wherein a part of an absorber layer is removed by patterning.

Here, R2 is the reflectance of a surface of the reflective layer 3 (a surface of a protective layer when the protective layer is formed on the reflective layer 3) at the wavelength of EUV light, R1 is the reflectance of a surface of the absorber layer 4 (a surface of a low reflectance layer in a case where the low reflective layer for the wavelength of inspection light is formed on the absorber layer 4 as described later) at the wavelength of EUV light. Here, the above R1 and R2 are measured in such a state that the absorber layer 4 is partially removed by patterning as shown in FIG. 4. Here, when a low reflective layer is formed on the absorber layer, the measurement is made in such a state that the absorber layer and the low reflective layer of the EUV mask blanks are partially removed by patterning. The above R2 is a value measured on a surface of the reflective layer 3 (a surface of a protective layer when the protective layer is formed on the reflective layer 3) exposed to the outside by removal of the absorber layer 4 (the absorber layer 4 and a low reflective layer when the low reflective layer is formed on the absorber layer 4) by patterning, and R1 is a value measured on a surface of the absorber layer 4 (a surface of a low reflective layer when the low reflective layer is formed on the absorber layer 4) remaining without being removed by the patterning.

The EUV mask blank and the EUV mask of the present invention preferably have a contrast of at least 60%, more preferably at least 65%, particularly preferably at least 70%, in terms of the contrast of reflection light represented by the above formula.

In order to achieve the above contrast of reflection light, the absorber layer 4 preferably has an extremely low reflectance for EUV light beam. Specifically, when a light beam in the wavelength region of EUV light is incident into a surface of the absorber layer 4, the maximum reflectance at a wavelength in the vicinity of 13.5 nm is preferably at most 0.5%, more preferably at most 0.1%.

Here, when a low reflective layer is formed on the absorber layer 4, and when a light beam in the wavelength region of EUV light is incident into a surface of the low reflective layer, the maximum light beam reflectance at an wavelength in the vicinity of 13.5 nm is preferably at most 0.5%, more preferably at most 0.1%.

In order to achieve the above properties, the absorber layer 4 is constituted by a material having a high absorption coefficient for EUV light. As the material having a high absorption coefficient for EUV light, a material containing tantalum (Ta) as the main component is preferred. In this specification, a material containing tantalum (Ta) as the main component means a material containing Ta in an amount of at least 40 at %, preferably at least 50 at %, more preferably at least 55 at %.

The material containing Ta as the main component to be employed for the absorber layer 4, may contain besides Ta, at least one element selected from the group consisting of hafnium (Hf), silicon (Si), zirconium (Zr), germanium (Ge), boron (B) and nitrogen (N). A specific material containing the above element besides Ta may, for example, be TaN, TaNH, TaHf, TaHfN, TaBSi, TaBSiN, TaB, TaBN, TaSi, TaSiN, TaGe, TaGeN, TaZr or TaZrN.

Here, the absorber layer 4 preferably contains no oxygen (O). Specifically, the content of O in the absorber layer 4 is preferably less than 25 at %. At a time of patterning the absorber layer 4, a dry etching process is usually employed, and a chlorine type gas (or a mixed gas containing a chlorine type gas) or a fluorine gas (or a mixed gas containing a fluorine type gas) is usually used as the etching gas. In a case where a film containing Ru or an Ru compound is formed as a protective layer on the reflective layer for the purpose of preventing the reflective layer from being damaged by the etching process, a chlorine type gas is mainly used as the etching gas since the damage of the protective layer is little. However, if the absorber layer 4 contains oxygen when the dry etching process is carried out by using the chlorine type gas, the etching rate decreases and the resist damage increases, such being not preferred. The content of oxygen in the absorber layer 4 is preferably at most 15 at %, particularly preferably at most 10 at %, further preferably at most 5 at %.

The thickness of the absorber layer 4 is preferably from 20 to 100 nm, more preferably from 25 to 90 nm, further preferably from 30 to 80 nm.

The absorber layer 4 having the above construction may be formed by carrying out a known film-deposition method such as a magnetron sputtering method or an ion beam sputtering method.

For example, in a case of forming a TaHf film as the absorber layer 4 by a magnetron sputtering method, it may be formed under the following conditions.

Sputtering target: HaHf compound target (Ta=30 to 70 at %, Hf=70 to 30 at %)

Sputtering gas: An inert gas such as Ar gas (gas pressure is $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Degree of vacuum before film-deposition: At most $1 \times 10^{-4}$ Pa, preferably at most $1 \times 10^{-5}$ Pa, more preferably at most $10^{-6}$ Pa)

Input power: 30 to 1,000 W, preferably 50 to 750 W, more preferably from 80 to 500 W Film-deposition speed: 2.0 to 60 nm/min, preferably 3.5 to 45 nm/min, more preferably 5 to 30 nm/min.

A low reflective layer for inspection light may be formed on the absorber layer 4. In a case of forming the low reflective layer, the low reflective layer is constituted by a film having a low reflectance for inspection light used for inspection of mask pattern. At a time of producing the EUV mask, after the absorber layer is patterned, the mask is inspected to check whether the mask pattern is formed as designed. In the inspection of mask pattern, an inspection machine using light of about 257 nm as inspection light is usually employed. Namely, the inspection is made according to the contrast of reflection light in an wavelength region of about 257 nm. The absorber layer of an EUV mask blank has an extremely low EUV light beam reflectance and has excellent properties required for the absorber layer of an EUV mask blank, but with respect to the wavelength of inspection light, the absorber layer does not always have a sufficiently low light beam reflectance. As a result, a sufficient contrast for inspection may not be obtained. If a sufficient contrast for inspection is not be obtained, in the mask inspection, it is not possible to sufficiently judge defects of a pattern and to carry out accurate defect inspection.

By forming the low reflective layer for inspection light on the absorber layer, the contrast at the time of inspection can be improved. In other words, the light beam reflectance at the wavelength of inspection light becomes extremely low. Specifically, when a light beam in the wavelength region of inspection light is incident into a surface of the low reflective layer, the maximum light beam reflectance at the wavelength of inspection light is preferably at most 15%, more preferably at most 10%, further preferably at most 5%.

When the light beam reflectance of the low reflective layer at the wavelength of inspection light is at most 15%, the contrast at the time of inspection is good. Specifically, the contrast of reflection light in the wavelength region of inspection light obtained by the above formula becomes at least 30%.

When the low reflective layer for the inspection light is formed on the absorber layer, the total thickness of the absorber layer and the low reflective layer is preferably from 20 to 100 nm, more preferably from 25 to 90 nm, further preferably from 30 to 80 nm.

Here, in the EUV mask blank of the present invention, the reason why the low reflective layer is preferably formed on the absorber layer is because the wavelength of inspection light is different from the wavelength of EUV light. Accordingly, in a case of using EUV light (in the vicinity of 13.5 nm) as the inspection light of the pattern, it is considered to be unnecessary to form the low reflective layer on the absorber layer. The wavelength of inspection light tends to shift in a shorter wavelength side as the pattern dimension becomes smaller, and in the future, the wavelength may shift to 193 nm and further to 13.5 nm. When the wavelength of inspection light is 13.5 nm, it is considered to be unnecessary to form the low reflective layer on the absorber layer.

The low reflective layer is preferably amorphous in terms of the crystal state. When it is amorphous, the surface is excellent in smoothness. Specifically, the surface roughness (rms) of the surface of the low reflective layer in the surface quality area is preferably at most 2 nm, more preferably at most 1 nm, further preferably at most 0.5 nm, still more preferably at most 0.4 nm, particularly preferably at most 0.3 nm. Here, when the low reflective layer is not formed on the absorber layer, the crystal state of the absorber layer is preferably amorphous, and the surface roughness (rms) of the surface of the absorber layer in the surface quality area is preferably at most 2 nm.

As described above, in order to prevent deterioration of dimension accuracy of the pattern due to the influence of edge roughness, the surface of the absorber layer is required to be smooth. Since the low reflective layer is formed on the absorber layer, the surface is required to be smooth for the same reason.

When the surface roughness (rms) of the surface of the low reflective layer (the surface of an absorber layer when the low reflective layer is formed on the absorber layer) in the surface quality area is at most 2 nm, the surface of the flow reflective layer is sufficiently flat and there is no risk of deterioration of dimension accuracy of the pattern due to the influence of edge flatness. The surface roughness (rms) of the surface of the low reflective layer in the surface quality area is preferably at most 1 nm, more preferably at most 0.5 nm, still more preferably at most 0.4 nm, particularly preferably at most 0.3 nm. For the purpose of reducing the surface roughness, the low reflective layer preferably contains N.

Here, an amorphous crystal state of the absorber layer or the low reflective layer, that is, an amorphous structure or a fine crystal structure, can be confirmed by an X-ray diffraction (XRD) method. When the crystal state of the absorber layer or the low reflective layer is an amorphous structure or a fine crystal structure, no sharp peak is observed in a diffraction curve obtained by the XRD measurement.

The low reflective layer having the above construction can be formed by carrying out the sputtering method such as a magnetron sputtering method or an ion beam sputtering method.

In the EUV mask blank of the present invention, in order to achieve good exposure, the surface roughness (rms) of the outermost layer (absorber layer or low reflective layer) in the surface quality area is preferably at most 2 nm, more preferably at most 1 nm, still more preferably at most 0.5 nm, further preferably at most 0.4 nm, particularly preferably at most 0.3 nm. By improving the standard deviation ($\sigma$) of the stress or the maximum variation (PV) of the stress like the present invention, e.g. the reflectance distribution of the EUV mask blank can be improved, such being preferred. In the EUV mask blank, the value of reflectance usually changes depending on the wavelength for measurement, and there is the maximum value $R_{max}$. In this specification, the maximum value $R_{max}$ is designated as the peak reflectance in the EUV wavelength region. The requirement of the uniformity of the peak reflectance in the surface quality area is preferably within ±1.2%, particularly preferably ±0.6%, further preferably ±0.3%. Further, in the EUV mask blank of the present invention, the requirement of the uniformity of the central wavelength of reflection light in the entire surface of the multilayer reflective film is within ±0.03 nm, preferably within ±0.01 nm. Here, the requirement of the uniformity of central wavelength means the tolerance of the difference between the largest central wavelength and the smallest central wavelength when the central wavelength is measured over the entire surface of the multilayer reflective film.

The EUV mask blank 1 of the present invention may have a functional film known in the field of EUV mask blanks, in addition to the reflective layer, the absorber layer and optional layers that are the protective layer and the low reflective layer. As a specific example of such a functional film, a high dielectric coating may be mentioned which is applied on the rear side of a substrate in order to accelerate electrostatic chucking of the substrate, as disclosed in e.g. WO00/75727. Here, in the EUV mask blank 150 in FIG. 3, the rear surface of the substrate 11 means the surface on the side opposite to the side on which the reflective layer 3 is formed. For the high dielectric coating to be provided on the rear surface of the substrate for such a purpose, the electrical conductivity and the thickness of the constituting material are selected so that the sheet resistance will be at most 100 $\omega/\square$. The constituting material for the high dielectric coating may be selected widely from those disclosed in known literatures. For example, a high dielectric coating disclosed in Patent Documents 10 and 11, specifically, a coating comprising silicon, TiN, molybdenum, chromium or TaSi, may be applied. The thickness of the high dielectric coating may, for example, be from 10 to 1,000 nm.

The high dielectric coating may be formed by using a known film deposition method, for example, a sputtering method such as magnetron sputtering or ion beam sputtering, a CVD method, a vacuum deposition method or an electrolytic plating method.

By patterning at least the absorber layer of the EUV mask blank of the present invention, it is possible to produce an EUV mask. The method for patterning the absorber layer is not particularly limited, and it may, for example, be a method of coating a resist on the absorber, forming a resist pattern and etching the absorber layer using the resist pattern as a mask. The material of the resist or the method for creating the resist pattern may be appropriately selected considering e.g. the material of the absorber layer. The method for etching the absorber layer is also not particularly limited, and it may be a dry etching such as a reactive ion etching, or a wet etching. After the absorber layer is patterned, the resist is removed by a remover solution to obtain an EUV mask.

A process for producing a semiconductor integrated circuit by employing the EUV mask according to the present invention will be described. The present invention can be applied to a process for producing a semiconductor integrated circuit by a photolithography method employing EUV light as an exposure light source. Specifically, a substrate such as a silicon wafer coated with a resist is mounted on a stage, and the above EUV mask is mounted on a catopric exposure apparatus constituted by a combination of reflective mirrors. Then, EUV light from a light source is incident into the EUV mask via the reflective mirrors, and the EUV light is reflected by the EUV mask to be incident into the substrate coated with the resist. By this pattern transferring step, a circuit pattern is transferred onto the substrate. The substrate on which the circuit pattern is transferred is subjected to developing, exposed portions or non-exposed portions are removed by etching, and the resist is removed. By repeating such a step, the semiconductor integrated circuit is produced.

EXAMPLES

Now, the present invention will be described in further detail with reference to Examples, but the present invention is by no means restricted thereto. Here, Examples 1, 3 and 4 are Examples of the present invention, and Example 2 is a Comparative Example.

Example 1

$TiCl_4$ and $SiCl_4$ as glass-forming materials of $TiO_2$-$SiO_2$, which have been each vitrified, are mixed. A mixed product obtained is heat-hydrolyzed (flame-hydrolyzed) in an oxygen-hydrogen flame to obtain $TiO_2$-$SiO_2$ glass fine particles, and they are deposited and grown on a seed rod rotating at a rotation speed of 100 rpm to form a porous $TiO_2$-$SiO_2$ glass body (Step (a)). In this case, the glass body is formed by heating the seed rod from a lower end thereof by use of a burner. The angle of the burner is set to 8° with respect to the vertical direction. Here, the variation widths in the gas temperatures of $SiCl_4$ and $TiCl_4$ in supply pipings are controlled to be within ±0.5° C., and a stirring mechanism of the source gases is provided at a point just before supplying $SiCl_4$ and $TiCl_4$ to a burner.

In order to improve a handling property, the porous $TiO_2$—$SiO_2$ glass body obtained is maintained at a temperature of 1,200° C. for 6 hours in the atmospheric air in a state that the glass body is deposited on a substratum, and thereafter, the glass body is taken out from the seed rod.

Thereafter, the porous $TiO_2$—$SiO_2$ glass body taken out is placed in an electric furnace capable of controlling the atmosphere, the pressure is reduced to 10 Torr at room temperature, and thereafter, the glass body is heated to 1,450° C. in a helium gas atmosphere, and the temperature is maintained for 4 hours to obtain a $TiO_2$—$SiO_2$ dense body (Step (b)).

The $TiO_2$-$SiO_2$ dense body obtained is heated to a temperature of 1,700° C. in an argon atmosphere by using a carbon furnace, to obtain a transparent $TiO_2$-$SiO_2$ dense body (Step (c)).

The transparent $TiO_2$—$SiO_2$ glass body obtained is heated to 1,750° C. to form it into a desired shape to obtain a formed $TiO_2$—$SiO_2$ glass body (Step (d)).

The glass body obtained is maintained at a temperature of 1,100° C. for 10 hours, and the temperature of the glass is lowered to a temperature of 500° C. at a speed of 3° C/hr. and the glass is left for cooling in the atmospheric air to obtain an annealed TiO$_2$-SiO$_2$ glass body (Step (e)).

The annealed TiO$_2$—SiO$_2$ glass body obtained is maintained at a temperature of 500° C. for 72 hours in a 1 atm atmosphere of 100% hydrogen to obtain a TiO$_2$—SiO$_2$ glass body containing hydrogen (Step (f)).

The glass body obtained is cut into 40 pieces of plates each having shape of about 153.0 mm high×about 153.0 mm wide×about 6.75 mm thick. Subsequently, they are each subjected to a chamfering process using a commercial NC chamfering machine with a diamond grinding stone of #120 so that vertical and lateral outer dimensions become about 152 mm and a chamfering width becomes from 0.2 to 0.4 mm. Subsequently, the principal surfaces of each plate are subjected to a polishing process by using a 20B double side lapping machine (manufactured by Speedfam Co., Ltd.) with a polishing agent that is a slurry produced by dispersing from 18 to 20 mass % of GC#400 (product name, manufactured by Fujimi Incorporated) consisting essentially of SiC in a filtered water, so that the thickness becomes about 6.6 mm.

Next, as a first polishing, polishing of both surfaces are carried out to remove about 50 μm by using the 20B double side polishing machine with a polishing cloth LP66 (product name, manufactured by Rhodes) made of urethane and a polishing agent that is slurry produced by suspending in a filtered water Mirek 801A (product name, manufactured by Mitsui Mining & Smelting Co., Ltd.) containing cerium oxide as the main component.

Further, polishing (second polishing) of both surfaces is carried out to remove about 10 μm by using the 20B double side polishing machine and a polishing cloth Seagull 7355 (product name, manufactured by Toray Coatex), and thereafter, by using another polishing machine, a final polishing (third polishing) is carried out. In this final polishing, a colloidal silica (Compole 20: product name, manufactured by Fujimi Incorporated) is used as a polishing agent and Bellatrix K7512 (product name, manufactured by Kanebo) is used as a polishing cloth.

Subsequently, with respect to a substratum of each of these groups, cleaning is carried out in a multi-stage automatic cleaning machine having a first bath with a hot solution of sulfuric acid and aqueous hydrogen peroxide and a third bath with a neutral surfactant solution. Thereafter, by using a photomask surface defect inspection machine M1350 (manufactured by Lasertec Corporation), the number of defects (convex projections or foreign substances or concave pits) having a size of at least 60 nm present on a surface of each substratum is measured, and only substrates in the level of no problem are selected.

With respect to each substrate after the above inspection is cut along a line passing through a central point 40 of a surface 20 and in parallel with sides of the substrate as shown in FIG. 1. Accordingly, a cross section 50 across the center of the substrate appears. Subsequently, the substrate is cut so that the thickness of the cross section 50 becomes 1 mm, and cross sections obtained are subjected to double-side polishing.

Figure 5:
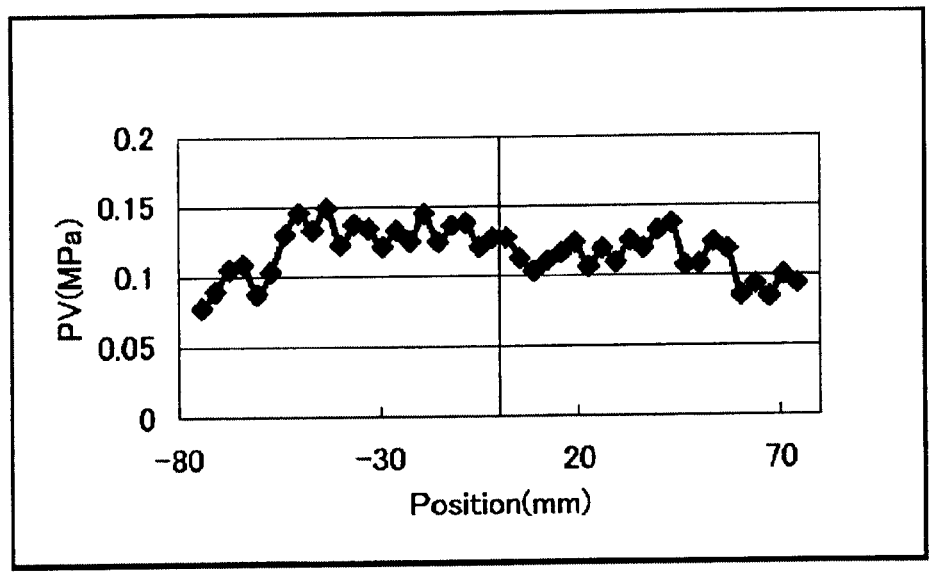
FIG. 5 is a graph showing the maximum variation (PV) of the stress of the substrate of Example 1.
Figure 6:
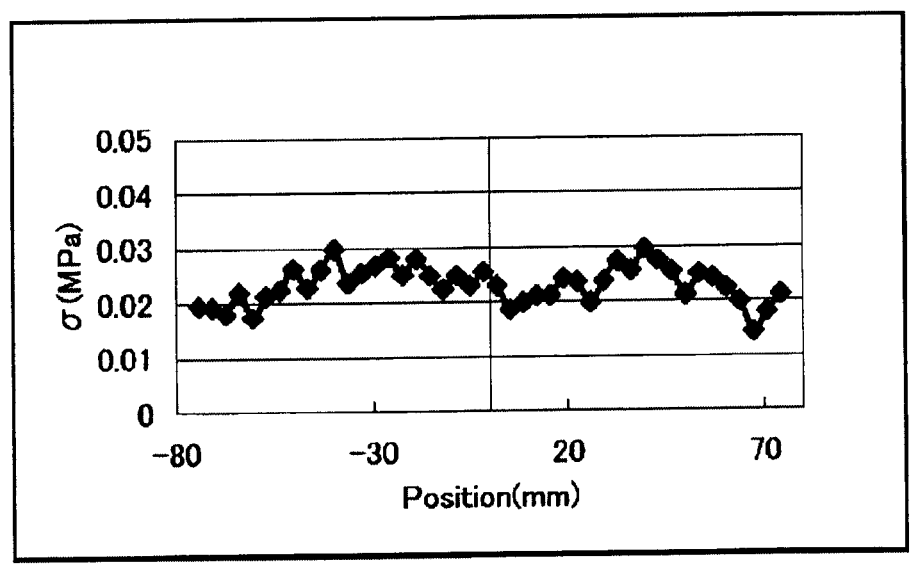
FIG. 6 is a graph showing the standard deviation (σ) of the stress of the substrate of Example 1.

Light of 546 nm is incident perpendicularly to the cross section 50 that is a polished surface (the measurement points are within the specific measurement areas centering the points shown in FIG. 2) and using a birefringent imaging system (a measurement system including a microscope, which is capable of separating a refractive index distribution and a stress), a retardation at each measurement point in the specific measurement areas is measured with a magnification covering a wide observation range capable of sufficiently observing striae. The retardation measured is converted to a stress by formula (1). With respect to each measurement point, the values of the maximum variation (PV) of the stress and the standard deviation (σ) of the stress that are obtained by the conversion are shown in Tables 1 and 2, and the graphs are shown in FIGS. 5 and 6.

Figure 7:
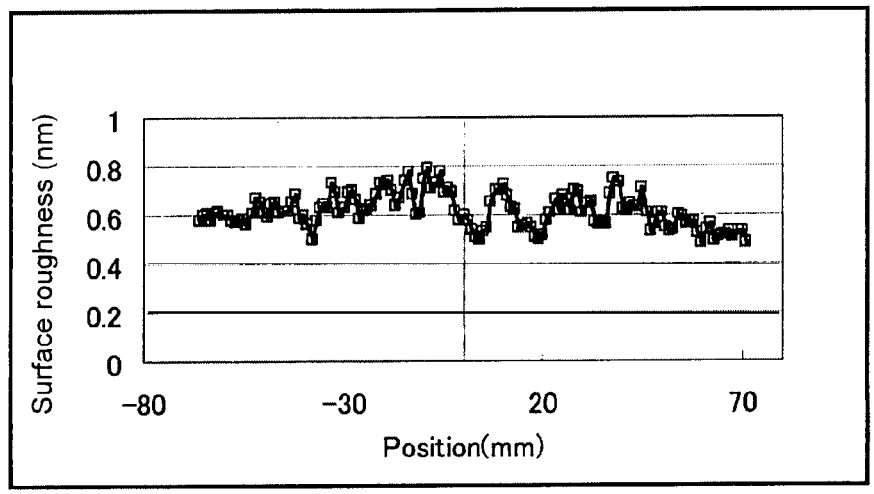
FIG. 7 is a graph showing the surface roughness (rms) of the substrate of Example 1.

Further, measurement of the surface roughness (rms) is carried out over the entire substrate at intervals of 1 mm along a line 52 corresponding to the surface 20 on the cross section 50 that is used for the measurement of retardation. The measurement employs a non-contact surface profiler (NewView manufactured by ZYGO Corporation). Tables 3 to 6 show the results and FIG. 7 shows the graph.

Here, "measurement No. 22 and 23" are measurement points at the center of the substrate, which correspond to position 0 nm in Table 4.

Example 2

Comparative Example

A substrate is prepared in the same manner as Example 1 except that the angle of the burner is set to 4° with respect to the vertical direction in Step (a). Also in this Example, the number of particles (foreign substances) having a size of at least 60 nm present on a surface of each substratum is measured by a photomask surface defect inspection machine, and only substrates in a level of no problem are selected.

Figure 8:
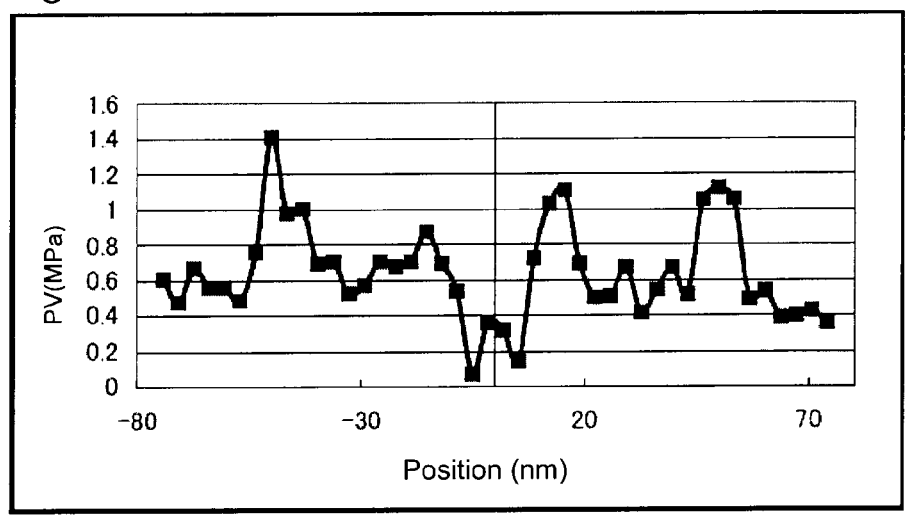
FIG. 8 is a graph showing the maximum variation (PV) of the stress of the substrate of Example 2.
Figure 9:
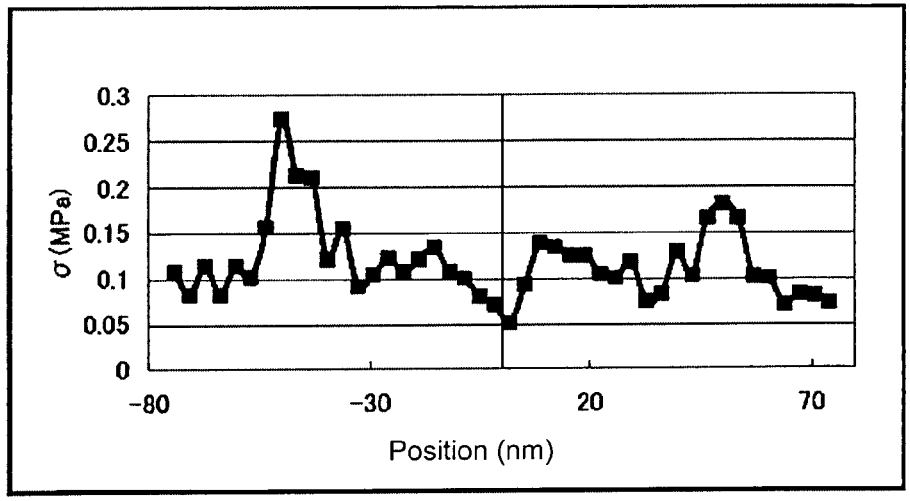
FIG. 9 is another graph showing the standard deviation (σ) of the stress of the substrate of Example 2.
Figure 10:
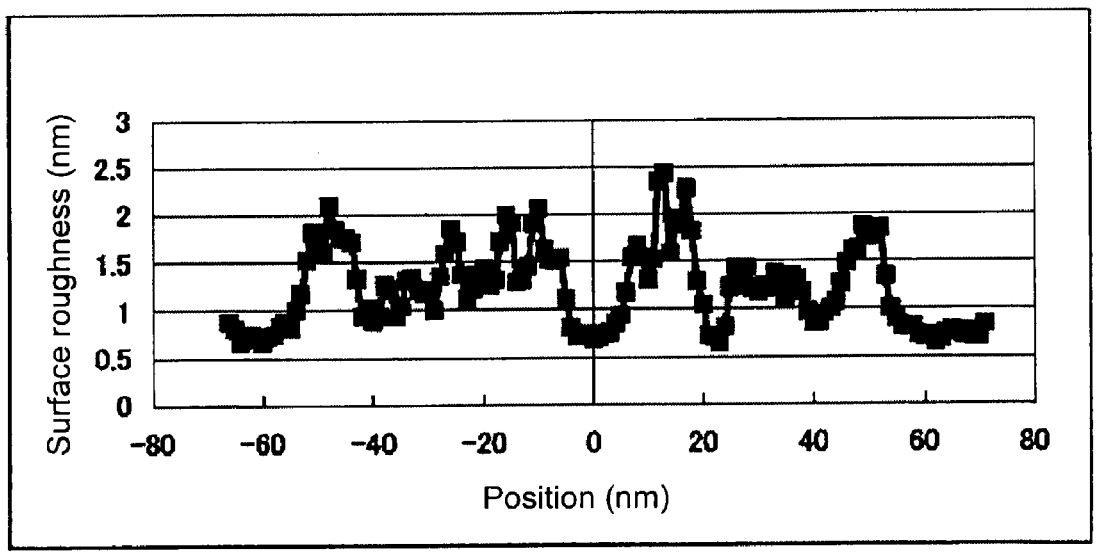
FIG. 10 is a graph showing the surface roughness (rms) of the substrate of Example 2.

With respect to each substrate obtained, the maximum variation (PV) of the stress, the standard deviation(σ) of the stress and the surface roughness (rms) are measured. Tables 1 to 6 show the results, and FIGS. 8, 9 and 10 show the graphs.

TABLE 1

| | | Example 1 | | Example 2 | |
|---|---|---|---|---|---|
| M No. | Position (mm) | Stress PV (MPa) | Stress σ (MPa) | Stress PV (MPa) | Stress σ (MPa) |
| 1 | −74.175 | 0.078 | 0.020 | 0.606 | 0.108 |
| 2 | −70.725 | 0.090 | 0.019 | 0.472 | 0.083 |
| 3 | −67.275 | 0.105 | 0.018 | 0.667 | 0.115 |
| 4 | −63.825 | 0.109 | 0.022 | 0.558 | 0.083 |
| 5 | −60.375 | 0.088 | 0.017 | 0.558 | 0.115 |
| 6 | −56.925 | 0.103 | 0.021 | 0.483 | 0.102 |
| 7 | −53.475 | 0.130 | 0.022 | 0.757 | 0.156 |
| 8 | −50.025 | 0.146 | 0.026 | 1.408 | 0.274 |
| 9 | −46.575 | 0.133 | 0.023 | 0.979 | 0.214 |
| 10 | −43.125 | 0.149 | 0.026 | 1.003 | 0.210 |
| 11 | −39.675 | 0.123 | 0.030 | 0.692 | 0.121 |
| 12 | −36.225 | 0.137 | 0.024 | 0.705 | 0.155 |
| 13 | −32.775 | 0.134 | 0.025 | 0.525 | 0.092 |
| 14 | −29.325 | 0.121 | 0.027 | 0.569 | 0.105 |
| 15 | −25.875 | 0.133 | 0.028 | 0.705 | 0.123 |
| 16 | −22.425 | 0.125 | 0.025 | 0.675 | 0.108 |
| 17 | −18.975 | 0.145 | 0.028 | 0.703 | 0.121 |
| 18 | −15.525 | 0.124 | 0.025 | 0.872 | 0.134 |
| 19 | −12.075 | 0.136 | 0.022 | 0.694 | 0.108 |
| 20 | −8.625 | 0.138 | 0.025 | 0.536 | 0.100 |
| 21 | −5.175 | 0.121 | 0.023 | 0.070 | 0.081 |
| 22 | −1.725 | 0.127 | 0.025 | 0.362 | 0.072 |

M No.: Measurement No.

TABLE 2

| | | Example 1 | | Example 2 | |
|---|---|---|---|---|---|
| M No. | Position (mm) | Stress PV (MPa) | Stress σ (MPa) | Stress PV (MPa) | Stress σ (MPa) |
| 23 | 1.725 | 0.127 | 0.023 | 0.316 | 0.051 |
| 24 | 5.175 | 0.113 | 0.019 | 0.144 | 0.094 |

TABLE 2-continued

| M No. | Position (mm) | Example 1 Stress PV (MPa) | Example 1 Stress σ (MPa) | Example 2 Stress PV (MPa) | Example 2 Stress σ (MPa) |
|---|---|---|---|---|---|
| 25 | 8.625 | 0.103 | 0.020 | 0.724 | 0.139 |
| 26 | 12.075 | 0.111 | 0.021 | 1.030 | 0.134 |
| 27 | 15.525 | 0.116 | 0.021 | 1.107 | 0.126 |
| 28 | 18.975 | 0.124 | 0.024 | 0.692 | 0.126 |
| 29 | 22.425 | 0.106 | 0.024 | 0.501 | 0.105 |
| 30 | 25.875 | 0.119 | 0.020 | 0.507 | 0.100 |
| 31 | 29.325 | 0.109 | 0.024 | 0.670 | 0.118 |
| 32 | 32.775 | 0.125 | 0.027 | 0.416 | 0.075 |
| 33 | 36.225 | 0.119 | 0.026 | 0.542 | 0.083 |
| 34 | 39.675 | 0.132 | 0.030 | 0.670 | 0.129 |
| 35 | 43.125 | 0.137 | 0.028 | 0.517 | 0.104 |
| 36 | 46.575 | 0.107 | 0.026 | 1.052 | 0.166 |
| 37 | 50.025 | 0.108 | 0.021 | 1.118 | 0.182 |
| 38 | 53.475 | 0.124 | 0.025 | 1.057 | 0.166 |
| 39 | 56.925 | 0.119 | 0.024 | 0.491 | 0.102 |
| 40 | 60.375 | 0.086 | 0.022 | 0.537 | 0.100 |
| 41 | 63.825 | 0.094 | 0.020 | 0.387 | 0.072 |
| 42 | 67.275 | 0.085 | 0.014 | 0.400 | 0.083 |
| 43 | 70.725 | 0.100 | 0.018 | 0.427 | 0.081 |
| 44 | 74.175 | 0.094 | 0.021 | 0.359 | 0.073 |

M No.: Measurement No.

TABLE 3

| Position (mm) | Example 1 Surface roughness (nm) | Example 2 Surface roughness (nm) |
|---|---|---|
| −66 | 0.579 | 0.876 |
| −65 | 0.6 | 0.805 |
| −64 | 0.605 | 0.660 |
| −63 | 0.577 | 0.705 |
| −62 | 0.609 | 0.755 |
| −61 | 0.612 | 0.714 |
| −60 | 0.603 | 0.659 |
| −59 | 0.597 | 0.730 |
| −58 | 0.578 | 0.749 |
| −57 | 0.572 | 0.836 |
| −56 | 0.58 | 0.884 |
| −55 | 0.585 | 0.811 |
| −54 | 0.565 | 0.997 |
| −53 | 0.608 | 1.173 |
| −52 | 0.666 | 1.524 |
| −51 | 0.655 | 1.817 |
| −50 | 0.606 | 1.657 |
| −49 | 0.596 | 1.616 |
| −48 | 0.65 | 2.104 |
| −47 | 0.651 | 1.843 |
| −46 | 0.607 | 1.768 |
| −45 | 0.615 | 1.760 |
| −44 | 0.614 | 1.720 |
| −43 | 0.653 | 1.331 |
| −42 | 0.682 | 0.941 |
| −41 | 0.587 | 1.028 |
| −40 | 0.6 | 0.884 |
| −39 | 0.562 | 0.942 |
| −38 | 0.501 | 1.260 |
| −37 | 0.579 | 1.212 |
| −36 | 0.629 | 0.935 |

TABLE 4

| Position (mm) | Example 1 Surface roughness (nm) | Example 2 Surface roughness (nm) |
|---|---|---|
| −35 | 0.553 | 1.042 |
| −34 | 0.620 | 1.318 |

TABLE 4-continued

| Position (mm) | Example 1 Surface roughness (nm) | Example 2 Surface roughness (nm) |
|---|---|---|
| −33 | 0.630 | 1.336 |
| −32 | 0.629 | 1.208 |
| −31 | 0.552 | 1.189 |
| −30 | 0.633 | 1.208 |
| −29 | 0.612 | 0.999 |
| −28 | 0.538 | 1.351 |
| −27 | 0.530 | 1.597 |
| −26 | 0.516 | 1.856 |
| −25 | 0.543 | 1.713 |
| −24 | 0.548 | 1.365 |
| −23 | 0.542 | 1.111 |
| −22 | 0.486 | 1.226 |
| −21 | 0.492 | 1.362 |
| −20 | 0.518 | 1.435 |
| −19 | 0.576 | 1.261 |
| −18 | 0.539 | 1.317 |
| −17 | 0.487 | 1.720 |
| −16 | 0.598 | 1.990 |
| −15 | 0.624 | 1.919 |
| −14 | 0.615 | 1.293 |
| −13 | 0.642 | 1.313 |
| −12 | 0.566 | 1.451 |
| −11 | 0.565 | 1.907 |
| −10 | 0.648 | 2.065 |
| −9 | 0.634 | 1.637 |
| −8 | 0.566 | 1.521 |
| −7 | 0.510 | 1.512 |
| −6 | 0.501 | 1.540 |
| −5 | 0.609 | 1.110 |
| −4 | 0.693 | 0.811 |
| −3 | 0.620 | 0.720 |
| −2 | 0.640 | 0.746 |
| −1 | 0.633 | 0.756 |
| 0 | 0.625 | 0.685 |

TABLE 5

| Position (mm) | Example 1 Surface roughness (nm) | Example 2 Surface roughness (nm) |
|---|---|---|
| 1 | 0.635 | 0.711 |
| 2 | 0.587 | 0.748 |
| 3 | 0.507 | 0.758 |
| 4 | 0.501 | 0.848 |
| 5 | 0.442 | 0.946 |
| 6 | 0.422 | 1.184 |
| 7 | 0.417 | 1.551 |
| 8 | 0.444 | 1.682 |
| 9 | 0.480 | 1.538 |
| 10 | 0.476 | 1.305 |
| 11 | 0.518 | 1.526 |
| 12 | 0.582 | 2.346 |
| 13 | 0.616 | 2.434 |
| 14 | 0.732 | 1.586 |
| 15 | 0.670 | 1.891 |
| 16 | 0.655 | 1.949 |
| 17 | 0.691 | 2.267 |
| 18 | 0.616 | 1.816 |
| 19 | 0.573 | 1.293 |
| 20 | 0.519 | 1.048 |
| 21 | 0.517 | 0.726 |
| 22 | 0.590 | 0.705 |
| 23 | 0.618 | 0.638 |
| 24 | 0.631 | 0.816 |
| 25 | 0.660 | 1.233 |
| 26 | 0.634 | 1.445 |
| 27 | 0.596 | 1.251 |
| 28 | 0.573 | 1.436 |
| 29 | 0.515 | 1.217 |
| 30 | 0.502 | 1.179 |

TABLE 5-continued

| Position (mm) | Example 1 Surface roughness (nm) | Example 2 Surface roughness (nm) |
|---|---|---|
| 31 | 0.505 | 1.245 |
| 32 | 0.497 | 1.220 |
| 33 | 0.534 | 1.382 |
| 34 | 0.559 | 1.324 |

TABLE 6

| Position (mm) | Example 1 Surface roughness (nm) | Example 2 Surface roughness (nm) |
|---|---|---|
| 35 | 0.563 | 1.101 |
| 36 | 0.481 | 1.355 |
| 37 | 0.456 | 1.312 |
| 38 | 0.486 | 1.179 |
| 39 | 0.552 | 0.975 |
| 40 | 0.594 | 0.852 |
| 41 | 0.600 | 0.851 |
| 42 | 0.630 | 0.956 |
| 43 | 0.620 | 1.000 |
| 44 | 0.592 | 1.071 |
| 45 | 0.579 | 1.264 |
| 46 | 0.492 | 1.475 |
| 47 | 0.495 | 1.608 |
| 48 | 0.506 | 1.627 |
| 49 | 0.472 | 1.864 |
| 50 | 0.440 | 1.761 |
| 51 | 0.457 | 1.787 |
| 52 | 0.432 | 1.841 |
| 53 | 0.461 | 1.341 |
| 54 | 0.463 | 1.001 |
| 55 | 0.459 | 0.891 |
| 56 | 0.462 | 0.817 |
| 57 | 0.430 | 0.807 |
| 58 | 0.423 | 0.821 |
| 59 | 0.439 | 0.736 |
| 60 | 0.444 | 0.698 |
| 61 | 0.443 | 0.718 |
| 62 | 0.423 | 0.648 |
| 63 | 0.429 | 0.676 |
| 64 | 0.464 | 0.753 |
| 65 | 0.452 | 0.782 |
| 66 | 0.448 | 0.755 |
| 67 | 0.435 | 0.717 |
| 68 | 0.418 | 0.759 |
| 69 | 0.448 | 0.714 |
| 70 | 0.441 | 0.708 |
| 71 | 0.419 | 0.842 |

As described above, the sample of Example 1 showed extremely good surface roughness. On the other hand, the substrate of Example 2 showed poor surface roughness, and it is not preferable for practical use.

Example 3

A substrate is prepared in the same manner as Example 1 except that the following Steps (a'), (c') and (e'), Step (d-1) and Step (d-2) are carried out instead of Steps (a), (c), (e) and Step (d).

$TiCl_4$ and $SiCl_4$ as glass-forming materials of $TiO_2$—$SiO_2$, which have been each vitrified, are mixed. A mixed product obtained is heat-hydrolyzed (flame-hydrolyzed) in an oxygen-hydrogen flame to obtain $TiO_2$—$SiO_2$ glass fine particles, and they are deposited and grown on a seed rod rotating at a rotation speed of 25 rpm to form a porous $TiO_2$—$SiO_2$ glass body (Step (a')).

The $TiO_2$—$SiO_2$ dense body obtained is heated to 1,680° C. in a carbon mold having a cylindrical shape with an inner diameter of Φ165 mm in an argon atmosphere by using a carbon furnace, to obtain a transparent $TiO_2$—$SiO_2$ dense body having a cylindrical shape of Φ165 mm (Step (c')).

The glass body obtained is maintained at a temperature of 1,000° C. for 10 hours, and at a temperature of 950° C. for 48 hours, and further, at a temperature of 900° C. for 48 hours, and thereafter, cooled in an electric furnace to obtain an annealed $TiO_2$—$SiO_2$ glass body (Step (e')).

A transparent $TiO_2$—$SiO_2$ glass body obtained is heated at 1,700° C. in a carbon mold having a cubic shape of 175 mm cube, to obtain a formed $TiO_2$—$SiO_2$ glass body (first formed product) having a cubic shape of 175 mm cube (Step (d-1)).

The outer periphery of the formed $TiO_2$—$SiO_2$ glass body obtained is cut so as to have a cross section of 123 mm square centering on he original center line, and it is heated again at 1,700° C. in a cubic carbon mold of 175 mm cube, to thereby obtain a cubic formed $TiO_2$—$SiO_2$ glass body (second formed body) of 175 mm cube (Step (d-2)).

Also in Example 3, the number of particles (foreign substances) having a size of at least 60 nm present on a surface of each substratum is measured by a photomask surface inspection machine, and only substrates in a level of no problem are selected.

Figure 11:
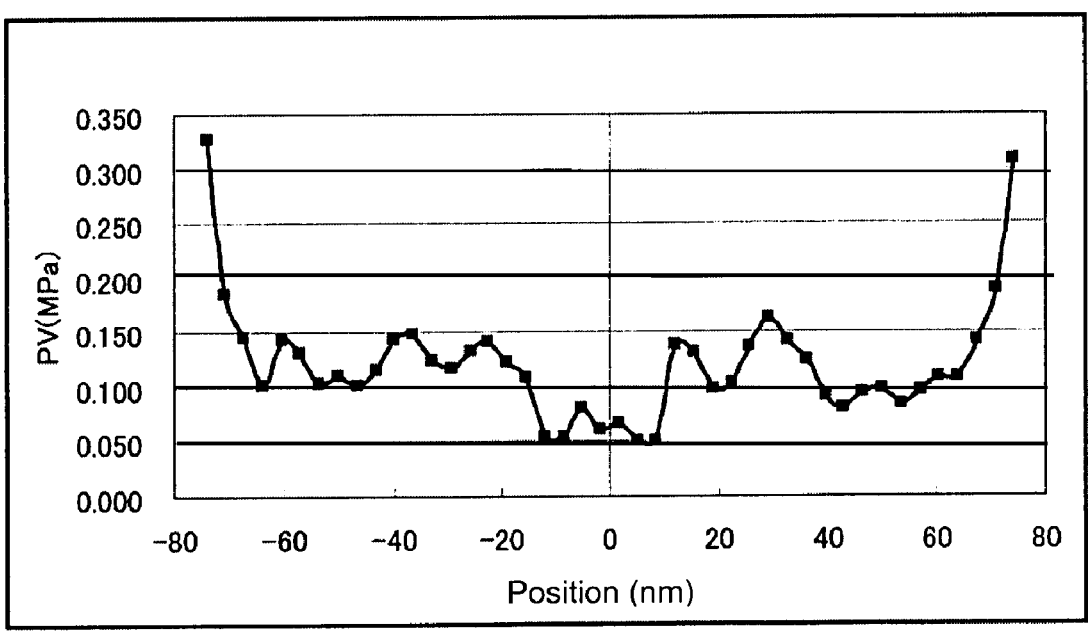
FIG. 11 is a graph showing the maximum variation (PV) of the stress of the substrate of Example 3.
Figure 12:
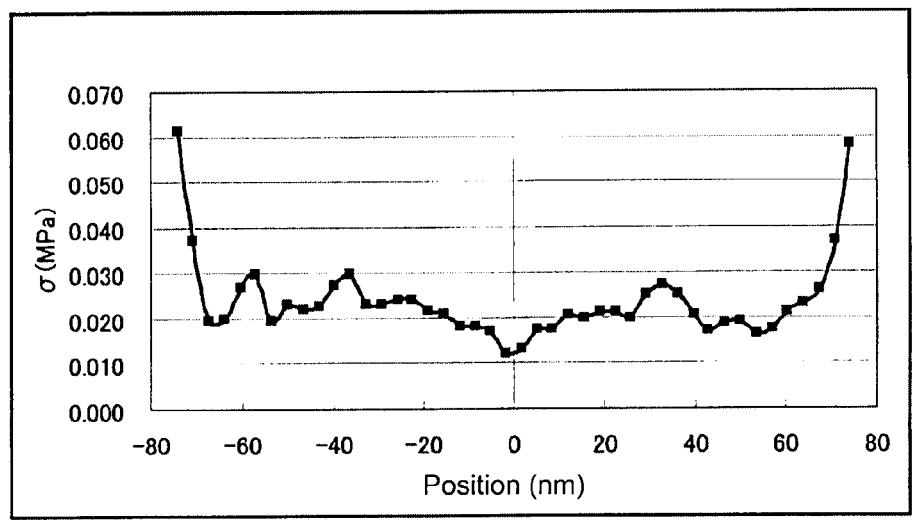
FIG. 12 is a graph showing the standard deviation (σ) of the stress of the substrate of Example 3.
Figure 13:
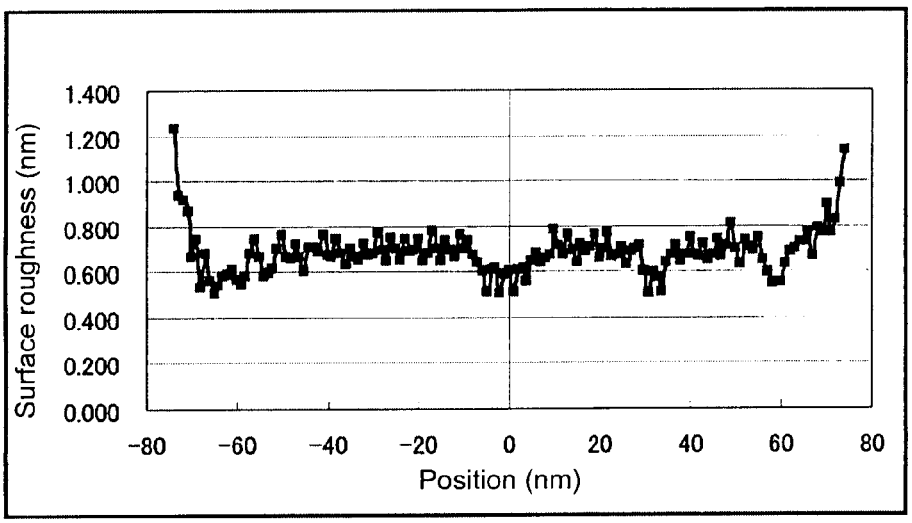
FIG. 13 is a graph showing the surface roughness (rms) of the substrate of Example 3.

With respect to each substrate obtained, the maximum variation (PV) of the stress, the standard deviation (σ) of the stress and the surface roughness (rms) are measured in the same manner as Example 1. Tables 7 to 12 show the results and FIGS. 11, 12 and 13 show the graphs.

Example 4

Comparative Example

A substrate is prepared in the same manner as Example 3 except that Step (d-2) is not carried out. Also in Example 4, the number of particles (foreign substances) having a size of at least 60 nm present on a surface of each substratum is measured by using a photomask surface defect inspection machine, and only substrates in a level of no problem are selected.

Figure 14:
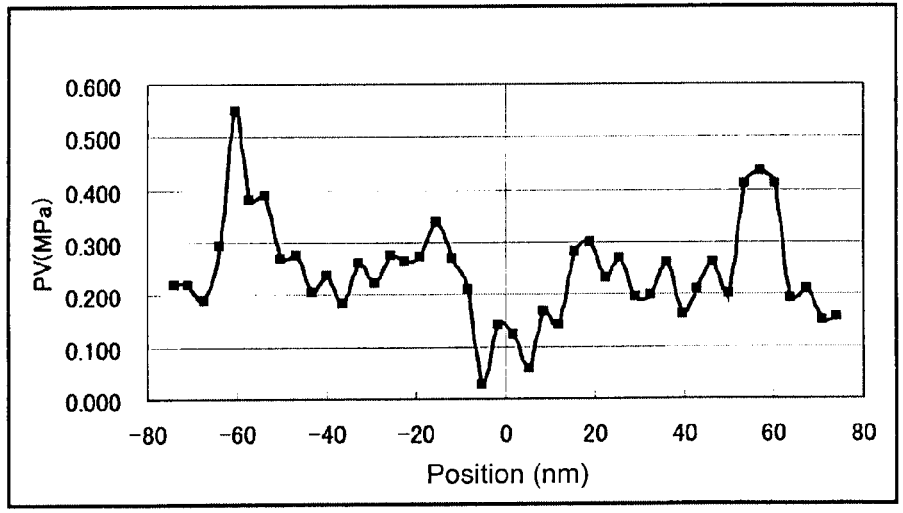
FIG. 14 is a graph showing the maximum variation (PV) of the stress of the substrate of Example 4.
Figure 15:
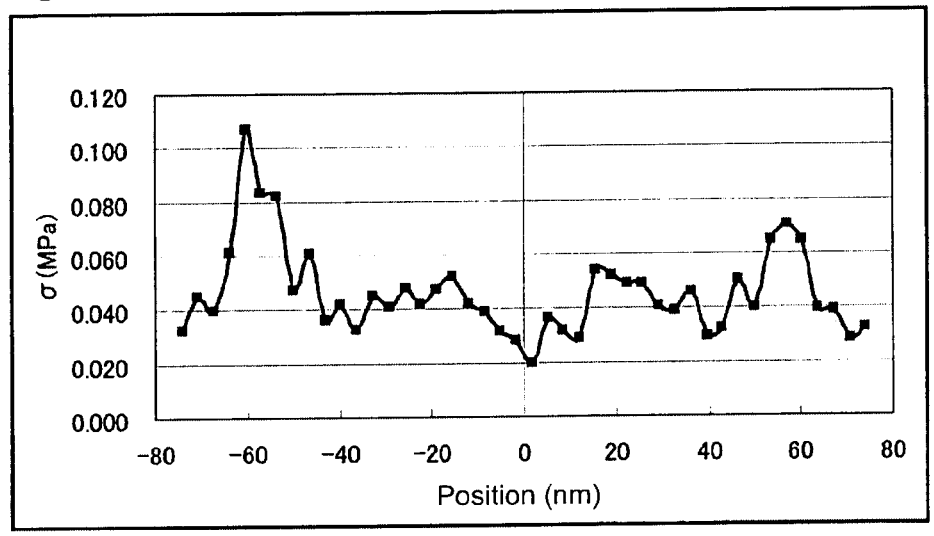
FIG. 15 is another graph showing the standard deviation (σ) of the stress of the substrate of Example 4.
Figure 16:
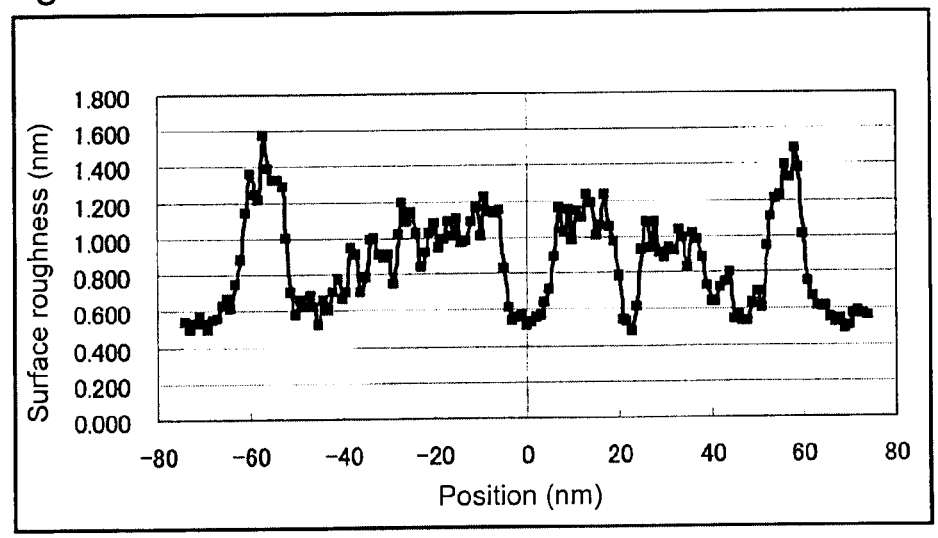
FIG. 16 is a graph showing the surface roughness (rms) of the substrate of Example 4.

With respect to each substrate obtained, the maximum variation (PV) of the stress, the standard deviation (σ) of the stress and the surface roughness (rms) are measured in the same manner as Example 1. Tables 7 to 12 show the results and FIGS. 14, 15 and 16 show the graphs.

TABLE 7

| M No. | Position (mm) | Example 3 Stress PV (MPa) | Example 3 Stress σ (MPa) | Example 4 Stress PV (MPa) | Example 4 Stress σ (MPa) |
|---|---|---|---|---|---|
| 1 | −74.175 | 0.327 | 0.061 | 0.218 | 0.032 |
| 2 | −70.725 | 0.185 | 0.037 | 0.218 | 0.045 |
| 3 | −67.275 | 0.146 | 0.019 | 0.188 | 0.04 |
| 4 | −63.825 | 0.102 | 0.02 | 0.295 | 0.061 |
| 5 | −60.375 | 0.143 | 0.027 | 0.549 | 0.107 |
| 6 | −56.925 | 0.131 | 0.03 | 0.382 | 0.083 |
| 7 | −53.475 | 0.102 | 0.02 | 0.391 | 0.082 |
| 8 | −50.025 | 0.11 | 0.023 | 0.27 | 0.047 |
| 9 | −46.575 | 0.101 | 0.022 | 0.275 | 0.06 |
| 10 | −43.125 | 0.115 | 0.023 | 0.205 | 0.036 |
| 11 | −39.675 | 0.143 | 0.027 | 0.236 | 0.042 |
| 12 | −36.225 | 0.148 | 0.03 | 0.184 | 0.032 |
| 13 | −32.775 | 0.124 | 0.023 | 0.26 | 0.045 |
| 14 | −29.325 | 0.118 | 0.023 | 0.222 | 0.041 |
| 15 | −25.875 | 0.133 | 0.024 | 0.275 | 0.048 |

TABLE 7-continued

| | | Example 3 | | Example 4 | |
| --- | --- | --- | --- | --- | --- |
| M No. | Position (mm) | Stress PV (MPa) | Stress σ (MPa) | Stress PV (MPa) | Stress σ (MPa) |
| 16 | −22.425 | 0.141 | 0.024 | 0.263 | 0.042 |
| 17 | −18.975 | 0.123 | 0.022 | 0.274 | 0.047 |
| 18 | −15.525 | 0.109 | 0.021 | 0.34 | 0.052 |
| 19 | −12.075 | 0.055 | 0.018 | 0.271 | 0.042 |
| 20 | −8.625 | 0.055 | 0.018 | 0.209 | 0.039 |
| 21 | −5.175 | 0.081 | 0.017 | 0.027 | 0.032 |
| 22 | −1.725 | 0.061 | 0.012 | 0.141 | 0.028 |

M No.: Measurement No.

TABLE 8

| | | Example 3 | | Example 4 | |
| --- | --- | --- | --- | --- | --- |
| M No. | Position (mm) | Stress PV (MPa) | Stress σ (MPa) | tress PV (MPa) | Stress σ (MPa) |
| 23 | 1.725 | 0.067 | 0.123 | 0.316 | 0.02 |
| 24 | 5.175 | 0.051 | 0.056 | 0.144 | 0.037 |
| 25 | 8.625 | 0.051 | 0.167 | 0.724 | 0.032 |
| 26 | 12.075 | 0.138 | 0.14 | 1.03 | 0.029 |
| 27 | 15.525 | 0.132 | 0.282 | 1.107 | 0.054 |
| 28 | 18.975 | 0.097 | 0.301 | 0.692 | 0.052 |
| 29 | 22.425 | 0.103 | 0.231 | 0.501 | 0.049 |
| 30 | 25.875 | 0.137 | 0.27 | 0.507 | 0.049 |
| 31 | 29.325 | 0.162 | 0.195 | 0.67 | 0.041 |
| 32 | 32.775 | 0.141 | 0.198 | 0.416 | 0.039 |
| 33 | 36.225 | 0.124 | 0.261 | 0.542 | 0.046 |
| 34 | 39.675 | 0.091 | 0.162 | 0.67 | 0.029 |
| 35 | 43.125 | 0.081 | 0.211 | 0.517 | 0.032 |
| 36 | 46.575 | 0.095 | 0.261 | 1.052 | 0.05 |
| 37 | 50.025 | 0.098 | 0.201 | 1.118 | 0.04 |
| 38 | 53.475 | 0.084 | 0.41 | 1.057 | 0.065 |
| 39 | 56.925 | 0.096 | 0.436 | 0.491 | 0.071 |
| 40 | 60.375 | 0.109 | 0.412 | 0.537 | 0.065 |
| 41 | 63.825 | 0.109 | 0.192 | 0.387 | 0.04 |
| 42 | 67.275 | 0.141 | 0.21 | 0.4 | 0.039 |
| 43 | 70.725 | 0.189 | 0.151 | 0.427 | 0.028 |
| 44 | 74.175 | 0.308 | 0.156 | 0.359 | 0.032 |

M No.: Measurement No.

TABLE 9

| Position (mm) | Example 3 Surface roughness (nm) | Example 4 Surface roughness (nm) |
| --- | --- | --- |
| −74 | 1.23 | 0.542 |
| −73 | 0.939 | 0.495 |
| −72 | 0.916 | 0.529 |
| −71 | 0.871 | 0.566 |
| −70 | 0.669 | 0.536 |
| −69 | 0.742 | 0.494 |
| −68 | 0.533 | 0.548 |
| −67 | 0.68 | 0.562 |
| −66 | 0.563 | 0.627 |
| −65 | 0.504 | 0.663 |
| −64 | 0.542 | 0.608 |
| −63 | 0.582 | 0.748 |
| −62 | 0.591 | 0.88 |
| −61 | 0.608 | 1.143 |
| −60 | 0.565 | 1.363 |
| −59 | 0.548 | 1.243 |
| −58 | 0.583 | 1.212 |
| −57 | 0.678 | 1.578 |
| −56 | 0.742 | 1.382 |
| −55 | 0.664 | 1.326 |
| −54 | 0.581 | 1.32 |
| −53 | 0.593 | 1.29 |
| −52 | 0.613 | 0.998 |

TABLE 9-continued

| Position (mm) | Example 3 Surface roughness (nm) | Example 4 Surface roughness (nm) |
| --- | --- | --- |
| −51 | 0.701 | 0.7 |
| −50 | 0.763 | 0.576 |
| −49 | 0.662 | 0.659 |
| −48 | 0.657 | 0.624 |
| −47 | 0.719 | 0.683 |
| −46 | 0.662 | 0.617 |
| −45 | 0.6 | 0.525 |
| −44 | 0.705 | 0.657 |
| −43 | 0.705 | 0.604 |
| −42 | 0.689 | 0.706 |
| −41 | 0.764 | 0.771 |
| −40 | 0.675 | 0.663 |
| −39 | 0.666 | 0.707 |
| −38 | 0.746 | 0.945 |
| −37 | 0.68 | 0.909 |
| −36 | 0.633 | 0.701 |

TABLE 10

| Position (mm) | Example 3 Surface roughness (nm) | Example 4 Surface roughness (nm) |
| --- | --- | --- |
| −35 | 0.701 | 0.782 |
| −34 | 0.668 | 0.989 |
| −33 | 0.649 | 1.002 |
| −32 | 0.719 | 0.906 |
| −31 | 0.671 | 0.891 |
| −30 | 0.678 | 0.906 |
| −29 | 0.773 | 0.749 |
| −28 | 0.695 | 1.013 |
| −27 | 0.645 | 1.198 |
| −26 | 0.747 | 1.088 |
| −25 | 0.702 | 1.14 |
| −24 | 0.654 | 1.024 |
| −23 | 0.742 | 0.833 |
| −22 | 0.688 | 0.92 |
| −21 | 0.694 | 1.022 |
| −20 | 0.739 | 1.076 |
| −19 | 0.645 | 0.946 |
| −18 | 0.678 | 0.988 |
| −17 | 0.78 | 1.088 |
| −16 | 0.702 | 1.005 |
| −15 | 0.641 | 1.11 |
| −14 | 0.737 | 0.97 |
| −13 | 0.696 | 0.985 |
| −12 | 0.664 | 1.088 |
| −11 | 0.766 | 1.17 |
| −10 | 0.702 | 1.005 |
| −9 | 0.739 | 1.228 |
| −8 | 0.672 | 1.141 |
| −7 | 0.634 | 1.134 |
| −6 | 0.602 | 1.155 |
| −5 | 0.513 | 0.833 |
| −4 | 0.611 | 0.608 |
| −3 | 0.615 | 0.54 |
| −2 | 0.504 | 0.56 |
| −1 | 0.59 | 0.567 |
| 0 | 0.599 | 0.514 |

TABLE 11

| Position (mm) | Example 3 Surface roughness (nm) | Example 4 Surface roughness (nm) |
| --- | --- | --- |
| 1 | 0.51 | 0.533 |
| 2 | 0.612 | 0.561 |

TABLE 11-continued

| Position (mm) | Example 3 Surface roughness (nm) | Example 4 Surface roughness (nm) |
|---|---|---|
| 3 | 0.615 | 0.569 |
| 4 | 0.562 | 0.636 |
| 5 | 0.647 | 0.71 |
| 6 | 0.681 | 0.888 |
| 7 | 0.639 | 1.163 |
| 8 | 0.655 | 1.028 |
| 9 | 0.675 | 1.154 |
| 10 | 0.786 | 0.979 |
| 11 | 0.711 | 1.145 |
| 12 | 0.671 | 1.11 |
| 13 | 0.763 | 1.238 |
| 14 | 0.692 | 1.19 |
| 15 | 0.638 | 1.005 |
| 16 | 0.722 | 1.065 |
| 17 | 0.684 | 1.238 |
| 18 | 0.705 | 1.05 |
| 19 | 0.761 | 0.97 |
| 20 | 0.656 | 0.786 |
| 21 | 0.702 | 0.545 |
| 22 | 0.768 | 0.529 |
| 23 | 0.666 | 0.479 |
| 24 | 0.675 | 0.612 |
| 25 | 0.705 | 0.925 |
| 26 | 0.63 | 1.084 |
| 27 | 0.688 | 0.938 |
| 28 | 0.702 | 1.077 |
| 29 | 0.717 | 0.913 |
| 30 | 0.604 | 0.884 |
| 31 | 0.501 | 0.934 |
| 32 | 0.597 | 0.915 |
| 33 | 0.573 | 1.037 |
| 34 | 0.509 | 0.993 |

TABLE 12

| Position (mm) | Example 3 Surface roughness (nm) | Example 4 Surface roughness (nm) |
|---|---|---|
| 35 | 0.636 | 0.825 |
| 36 | 0.67 | 1.016 |
| 37 | 0.713 | 0.984 |
| 38 | 0.644 | 0.884 |
| 39 | 0.675 | 0.731 |
| 40 | 0.746 | 0.639 |
| 41 | 0.671 | 0.638 |
| 42 | 0.665 | 0.717 |
| 43 | 0.719 | 0.75 |
| 44 | 0.654 | 0.803 |
| 45 | 0.674 | 0.538 |
| 46 | 0.74 | 0.569 |
| 47 | 0.666 | 0.536 |
| 48 | 0.715 | 0.531 |
| 49 | 0.812 | 0.632 |
| 50 | 0.697 | 0.69 |
| 51 | 0.63 | 0.6 |
| 52 | 0.737 | 0.948 |
| 53 | 0.707 | 1.106 |
| 54 | 0.694 | 1.206 |
| 55 | 0.747 | 1.22 |
| 56 | 0.654 | 1.398 |
| 57 | 0.593 | 1.321 |
| 58 | 0.548 | 1.485 |
| 59 | 0.556 | 1.381 |
| 60 | 0.555 | 1.006 |
| 61 | 0.632 | 0.751 |
| 62 | 0.685 | 0.668 |
| 63 | 0.7 | 0.613 |
| 64 | 0.725 | 0.605 |
| 65 | 0.725 | 0.616 |
| 66 | 0.773 | 0.552 |
| 67 | 0.664 | 0.524 |
| 68 | 0.792 | 0.539 |
| 69 | 0.771 | 0.486 |
| 70 | 0.893 | 0.507 |
| 71 | 0.769 | 0.565 |
| 72 | 0.829 | 0.587 |
| 73 | 0.984 | 0.566 |
| 74 | 1.134 | 0.557 |

As described above, the substrates of Examples 3 and 4 showed good surface roughness. The substrate of Example 3 has a high stress value outside the surface quality area. On the other hand, the substrate of Example 4 has no high stress value outside the surface quality area.

Further, in the substrates of Examples 1, 3 and 4, the thermal expansion coefficient was 0±125 ppb/° C. in a temperature range of from 0 to 100° C., the fictive temperature is 960° C., the variation of the fictive temperature was at most 20° C. in the entire substrate, the temperature at which the thermal expansion coefficient becomes 0 ppb/° C. was from 21 to 23° C., the OH group concentration was 60 ppm, and the variation of OH group concentration was at most 10 ppb in the entire substrate. Here, the above measurement method was used. The chlorine concentration was not detectable by a fluorescent X-ray, and considering the detection sensitivity, the concentration is estimated to be less than 10 ppm. The boron concentration is 25 ppb. The method for measuring the boron concentration is as follows. A substrate is pulverized and a part of it is cleaned with warm aqua regia and hydrofluoric acid, further cleaned with ultrapurified water, and dried. About 1 g of this cleaned sample is decomposed by a hydrofluoric acid and heat-concentrated, and ultrapurified water is added to the sample to be a constant volume. With respect to the constant volume liquid, a quantitative analysis of boron is carried out by an ICP mass analyzing method. The hydrogen concentration is $1.4 \times 10^{17}$ molecules/cm$^3$. The measurement of hydrogen molecule concentration is carried out as follows. Namely, by using a thermal desorption spectrometer (TDS) manufactured by DESCO, Ltd. according to Japanese Patent No. 3,298,974, integrated intensity ratio between respective hydrogen molecule desorption peaks of a measurement sample and a standard sample whose hydrogen concentration is known, is measured, and from the result, the number of desorbed hydrogen molecules of the measurement sample can be calculated. The Ti$^{3+}$ concentration is 4 ppm. The Ti$^{3+}$ concentration is measured by an electron spin resonance (ESR) measurement.

<Production of EUV Mask Blank>

A substrate equivalent to those of Examples 1 to 4 is used for a substrate for film-deposition. Specifically, the substrate is a SiO$_2$—TiO$_2$ type glass substrate (external shape is 6 inches (about 152 mm) square, about 6.3 mm thick) having a thermal expansion coefficient of 0.2×10$^{-7}$/° C., a Young's modulus of 67 Gpa, a Poisson's ratio of 0.17 and a specific rigidity of 3.07×10$^7$ m$^2$/s$^2$. In terms of the composition, TiO$_2$ is about 7 mass % and SiO$_2$ is about 93 mass %. The thermal expansion coefficient at 50° C. is 0±7 ppb/° C. The fictive temperature is 80° C., the OH group concentration is 30 ppm, the variation of the OH group concentration is 10 ppm, and the variation width (Δn) of refractive index is 300 ppm. The Ti$^{3+}$ concentration is at most 5 ppm. The chlorine concentration is 0 ppm. The temperature at which the thermal expansion coefficient of the substrate becomes 0 ppb/° C. is 50° C. The hydrogen concentration is $1.5 \times 10^{17}/cm^3$.

On a rear surface side of the substrate, a Cr film having a thickness of 100 nm is deposited by using a magnetron sputtering method to achieve a high dielectric coating having a sheet resistance of 100 ω/□.

Onto a common electrostatic chuck having a flat plate shape, by using the Cr film formed, the substrate is fixed, and in this state, by repeating 40 cycles of alternate deposition of Si films and Mo films on a surface of the substrate by using an ion beam sputtering method, a Si/Mo multilayer film (reflective layer) having a total film thickness of 272 nm ((4.5 nm+2.3 nm)×40) is formed.

Further, on the Si/Mo multilayer reflective film (reflective layer), an Ru film (film thickness is 2.5 nm) is deposited by using an ion beam sputtering method, to form a protective layer.

The film-deposition conditions of the Si film, Mo film and Ru film are as follows.
Film-deposition Conditions of Si Film
  Target: Si target (bron-doped)
  Sputtering gas: Ar gas (gas pressure is 0.02 Pa)
  Voltage: 700 V
  Film-deposition speed: 0.077 nm/sec
  Film thickness: 4.5 nm
Film-deposition Conditions of Mo Film
  Target: Mo target
  Sputtering gas: Ar gas (gas pressure is 0.02 Pa)
  Voltage: 700 V
  Film-deposition speed: 0.064 nm/sec
  Film thickness: 2.3 nm
Film-deposition Conditions of Ru Film
  Target: Ru target
  Sputtering gas: Ar gas (gas pressure is 0.02 Pa)
  Voltage: 500 V
  Film-deposition speed: 0.023 nm/sec
  Film thickness: 2.5 nm Next, on the protective layer, an absorber layer (TaHf film) containing Ta and Hf is formed by using a magnetron sputtering method, to thereby obtain an EUV mask blank constituted by the substrate, the reflective layer, the protective layer and the absorber layer formed on the substrate in this order.

The film-deposition conditions of the absorber layer are as follows.
Film-deposition conditions of absorber layer (TaHf film)
  Target: TaHf compound target (composition ratio is Ta 55 at % and Hf 45 at %)
  Sputtering gas: Ar gas (gas pressure is 0.3 Pa)
  Input power: 150 W
  Film-deposition speed: 0.29 nm/sec
  Film thickness: 60 nm
  Vacuum degree before film-deposition: $4 \times 10^{-6}$ Pa.

With respect to the absorber layer of EUV mask blank obtained by the above procedure, the following evaluations (1) to (4) are carried out.
(1) Film Composition
The composition of the absorber layer (TaHf film) is measured by using an X-ray photoelectron spectrometer (model 5500 manufactured by PERKIN ELEMER-PHI). The composition ratio (at %) of the absorber layer (TaHf film) is Ta:Hf=55:45 (the content of Ta is 55 at % and the content of Hf is 45 at %). The content of N in the absorber layer is at most 0.05 at %. The content of Zr in the absorber layer is from 0.3 to 0.7 at %.

(2) Crystal State
The crystal state of the absorber layer (TaHf film) is confirmed by an X-ray diffractmeter (manufactured by RIGAKU Corporation). Since no sharp peak is observed in a diffraction curve obtained, the crystal state of the absorber layer (TaHf film) is confirmed to be an amorphous structure or a microcrystal structure.
(3) Surface Roughness
The surface roughness of the absorber layer (TaHf film) is measured by using an atomic force microscope (SPI-3800 manufactured by SII) in a dynamic force mode. The measurement area of the surface roughness is 1 μm×1 μm, and a cantilever SI-DF40 (manufactured by SII) is employed. The surface roughness (rms) of the absorber layer in the surface quality area is 0.10 nm.

With respect to the substrates of Examples 3 and 4, the surface roughness of the absorber layer outside the surface quality area is as follows. In the case of a mask blank formed from the substrate of Example 3, the surface roughness is in such a level that an EUV lithography using a mask produced from the mask blank is not affected by EUV reflection light from the surface of the absorber layer along the periphery of the mask pattern area. On the other hand, in the case of a mask blank formed from the substrate of Example 4, the surface roughness is in such a level that an EUV lithography using a mask produced from the mask blank is affected by EUV reflection light from the surface of the absorber layer along the periphery of the mask pattern area.
(4) Resistance
The resistance of the absorber layer (TaHf film) is measured by using a four-probe meter (LorestaAPMCP-T400 manufactured by Mitsubishi Yuka) and as a result, it is $1.8 \times 10^{-4}$ ω·cm.
<Production of EUV Mask>
By patterning at least the absorber layer of the mask blank, a mask is obtained. The mask formed from each of the substrate of Examples 1, 3 and 4 is confirmed to have a sufficient performance required for a mask. On the other hand, a mask produced from the substrate of Example 2 does not have a sufficient performance required for a mask.

In the case of a mask produced from the substrate of Example 3, there is no influence of EUV reflection light from a surface of the absorber layer along the periphery of the mask pattern area at a time of carrying out an EUV lithography, and thus, the mask enables exposure as designed. On the other hand, in the case of the mask produced from the substrate of Example 4, there is an influence of EUV reflection light from the surface of the absorber layer along the periphery of mask pattern area at the time of carrying out an EUV lithography, which may make it difficult to expose as designed.

It is obvious for a person skilled in the art that various modifications or transformation can be made to the present invention so long as they do not depart from the concept or the scope of the present invention. Accordingly, so long as the modified or transformed invention is within the scope of the claims or the scope of equivalent thereof, the present invention covers these modified or transformed inventions. The entire disclosures of Japanese Patent Application No. 2008-199543 and Japanese Patent Application No. 2008-284444 including specifications, claims, drawings and summaries are incorporated herein by reference in their entireties.

What is claimed is:
1. A substrate, which is made of a silica glass containing from 1 to 12 mass % of $TiO_2$, wherein the surface roughness (rms) in a surface quality area of the substrate is at most 2 nm, and the standard deviation (σ) of the stress in the surface quality area of the substrate is at most 0.04 MPa.

2. A substrate, which is made of a silica glass containing from 1 to 12 mass % of $TiO_2$, wherein the surface roughness (rms) in a surface quality area of the substrate is at most 2 nm, and the maximum variation (PV) of the stress in the surface quality area of the substrate is at most 0.2 MPa.

3. The substrate according to claim 1, wherein the maximum variation (PV) of the stress in the surface quality area of the substrate is at most 0.2 MPa.

4. The substrate according to claim 1, wherein the surface roughness (rms) in the surface quality area of the substrate is at most 1 nm.

5. The substrate according to claim 1, wherein the standard deviation ($\sigma$) outside the surface quality area of the substrate is more than 0.05 MPa.

6. The substrate according to claim 1, wherein the maximum variation (PV) of the stress outside the surface quality area of the substrate is more than 0.2 MPa.

7. The substrate according to claim 5, wherein the maximum variation (PV) of the stress outside the surface quality area of the substrate is more than 0.2 MPa.

8. The substrate according to claim 4, wherein the standard deviation ($\sigma$) of the stress outside the surface quality area is at least 0.02 MPa higher than the standard deviation ($\sigma$) of the stress in the surface quality area.

9. The substrate according to claim 4, wherein the maximum variation (PV) outside the surface quality area is at least 0.1 MPa higher than the maximum variation (PV) in the surface quality area.

10. The substrate according to claim 8, wherein the maximum variation (PV) of the stress outside the surface quality area of the substrate is at least 0.1 MPa higher than the maximum variation (PV) in the surface quality area.

11. The substrate according to claim 1, wherein the thermal expansion coefficient of the substrate is 0±200 ppb/° C. in a temperature range of from 0 to 100° C.

12. The substrate according to claim 1, wherein the fictive temperature of the substrate is less than 1,000° C.

13. The substrate according to claim 1, wherein the variation of the fictive temperature in the entire substrate is at most 100° C.

14. The substrate according to claim 1, wherein the OH group concentration in the substrate is at most 600 ppm.

15. The substrate according to claim 1, wherein the variation of the OH group concentration in the entire substrate is at most 50 ppm.

16. The substrate according to claim 1, wherein the variation $\Delta n$ of the refractive index of the substrate is within $4 \times 10^{-4}$.

17. The substrate according to claim 1, wherein the surface roughness (rms) in the surface quality area of the substrate is at most 0.8 nm.

18. The substrate according to claim 1, wherein the temperature at which the thermal expansion coefficient of the substrate becomes 0 ppb/° C. is 22±3° C.

19. The substrate according to claim 1, wherein the temperature at which the thermal expansion coefficient of the substrate becomes 0 ppb/° C. is from 40 to 100° C.

20. The substrate according to claim 1, wherein the chlorine concentration of the substrate is at most 50 ppm.

21. The substrate according to claim 1, wherein the fluorine concentration of the substrate is at least 100 ppm.

22. The substrate according to claim 1, wherein the boron concentration of the substrate is at least 10 ppb.

23. The substrate according to claim 1, wherein the hydrogen concentration of the substrate is at least $5 \times 10^{16}$ molecules/$cm^3$.

24. The substrate according to claim 1, wherein the $Ti^{3+}$ concentration of the substrate is at most 70 ppm.

25. The substrate according to claim 1, wherein no concave pit of at least 60 nm is present on a surface in the surface quality area of the substrate.

26. The substrate according to claim 1, which is produced by a two-step forming method comprising heating a transparent $TiO_2$—$SiO_2$ glass body at a forming temperature to form a first formed body, cutting the outer periphery of the first formed body, and heating the first formed body at a forming temperature to form a second formed body.

27. The substrate according to claim 26 which is produced by a method of maintaining a formed $TiO_2$—$SiO_2$ glass body formed into a predetermined shape, at a temperature of from 800 to 1,200° C. for 2 hours, and lowering the temperature at an average temperature-falling speed of at most 10° C./hr to a temperature of at most 700° C.

28. An EUV mask blank comprising the substrate as defined in claim 1 and a reflective layer and an absorber layer that are formed on the substrate.

29. The EUV mask blank according to claim 28, wherein the surface roughness (rms) of the outermost layer of the EUV mask blank is at most 2 nm in the surface quality area.

30. The EUV mask blank according to claim 28, wherein the requirement of the uniformity of the peak reflectance of the reflective layer surface in the EUV wavelength region in the entire mask blank, is within ±1.2% in the surface quality area.

31. An EUV mask comprising the substrate as defined in claim 1, and a reflective layer and a patterned absorber layer that are formed on the substrate.

32. The EUV mask according to claim 31, wherein the influence of EUV reflection light from the surface of the absorber layer along the outer periphery of a mask pattern area is inhibited.

33. A process for producing semiconductor integrated circuits comprising employing the EUV mask as defined in claim 31.

* * * * *